United States Patent
Kajiro et al.

(10) Patent No.: US 11,127,898 B2
(45) Date of Patent: Sep. 21, 2021

(54) MICROSWITCH AND ELECTRONIC DEVICE IN WHICH SAME IS USED

(71) Applicants: NIPPON STEEL & SUMITOMO METAL CORPORATION, Tokyo (JP); NATIONAL UNIVERSITY CORPORATION TOTTORI UNIVERSITY, Tottori (JP)

(72) Inventors: Hiroshi Kajiro, Tokyo (JP); Toru Nagai, Tokyo (JP); Kentaro Kinoshita, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 654 days.

(21) Appl. No.: 16/071,296

(22) PCT Filed: Jan. 20, 2017

(86) PCT No.: PCT/JP2017/001949
§ 371 (c)(1),
(2) Date: Jul. 19, 2018

(87) PCT Pub. No.: WO2017/126664
PCT Pub. Date: Jul. 27, 2017

(65) Prior Publication Data
US 2021/0202836 A1 Jul. 1, 2021

(30) Foreign Application Priority Data
Jan. 22, 2016 (JP) .............................. JP2016-010864
Jan. 22, 2016 (JP) .............................. JP2016-010865

(51) Int. Cl.
*H01L 45/00* (2006.01)
(52) U.S. Cl.
CPC ........ *H01L 45/1226* (2013.01); *H01L 45/149* (2013.01); *H01L 45/1608* (2013.01)

(58) Field of Classification Search
CPC ............. H01L 45/1226; H01L 45/1608; H01L 45/149
See application file for complete search history.

(56) References Cited

U.S. PATENT DOCUMENTS 7,772,668 B2 * 8/2010 Pan ....................... H01L 29/407
257/492
9,685,619 B2 * 6/2017 Van Der Boom ..... H03K 19/21
(Continued)

FOREIGN PATENT DOCUMENTS

JP 2006-261677 A 9/2006
JP 2010-58034 A 3/2010
(Continued)

OTHER PUBLICATIONS

Avendano et al., "Dramatically Different Conductivity Properties of Metal-Organic Framework Polymorphs of TI(TCNQ): an Unexpected Room-Temperature Crystal-to-Crystal Phase Transition," Angew. Chem. Int. Ed., vol. 50, 2011, pp. 6543-6547.
(Continued)

*Primary Examiner* — Jarrett J Stark
(74) *Attorney, Agent, or Firm* — Birch, Stewart, Kolasch & Birch, LLP

(57) ABSTRACT

Provided is a microswitch including a first electrode, a second electrode, and a porous coordination polymer conductor, in which the porous coordination polymer conductor is represented by the following Formula (1), and a metal forming the first electrode and a metal forming the second electrode have different oxidation-reduction potentials, $$[ML_x]_n(D)_y \qquad (1),$$

where M represents a metal ion selected from group 2 to group 13 elements in a periodic table, L represents a ligand that has two or more functional groups capable of coordination to M in a structure of L and is cross-linkable with two M's, D represents a conductivity aid
(Continued)

that includes no metal element, x represents 0.5 to 4 and y represents 0.0001 to 20 with respect to x as 1, n represents the number of repeating units of a constituent unit represented by [ML$_x$], and n represents 5 or more.

21 Claims, 3 Drawing Sheets

(56) References Cited

U.S. PATENT DOCUMENTS

| | | | |
|---|---|---|---|
| 10,115,798 B2* | 10/2018 | Akiyama | H01L 21/283 |
| 10,793,683 B2* | 10/2020 | Johnson | C08F 293/005 |
| 10,871,464 B2* | 12/2020 | Ishige | G01N 27/3335 |
| 2006/0208248 A1 | 9/2006 | Lee et al. | |
| 2011/0207321 A1* | 8/2011 | Fujiwara | H01L 29/6606 438/663 |
| 2014/0306180 A1* | 10/2014 | Moriwaki | H01L 51/442 257/14 |
| 2015/0004499 A1 | 1/2015 | Kitagawa et al. | |
| 2015/0192548 A1* | 7/2015 | Wilkinson | G01N 29/2437 73/579 |
| 2015/0221865 A1 | 8/2015 | Tada et al. | |
| 2017/0278784 A1* | 9/2017 | Moriwaki | H01L 27/307 |
| 2018/0226596 A1* | 8/2018 | Moriwaki | H01L 27/146 |
| 2019/0245102 A1* | 8/2019 | Moriwaki | H01L 33/42 |
| 2020/0266309 A1* | 8/2020 | Moriwaki | H01L 31/022483 |
| 2021/0002304 A1* | 1/2021 | Helal | G01N 21/314 |

FOREIGN PATENT DOCUMENTS

| | | |
|---|---|---|
| JP | 4834048 B2 | 12/2011 |
| JP | 2015-46548 A | 3/2015 |
| WO | WO 2013/161452 A1 | 10/2013 |
| WO | WO 2014/030393 A1 | 2/2014 |

OTHER PUBLICATIONS

Banerjee et al., "High-Throughput Synthetis of Zeolitic Imidazolate Frameworks and Application to CO 2 Capture," Science, vol. 319, Feb. 15, 2008, pp. 939-943 (6 pages total).

Hasegawa et al., "Physical Properties Elucidation of Filaments in Conducting-Bridge Random Access Memory Consisting of Metal-Oxide," ECS Transactions, vol. 50, No. 34, 2013, pp. 61-67.

International Search Report (Form PCT/ISA/210) for International Application No. PCT/JP2017/001949, dated Apr. 11, 2017, with English translation.

Janiak, "Engineering Coordination Polymers Towards Applications," Dalton Trans., 2003 (published online Jun. 19, 2003), pp. 2781-2804.

Kepert, "Advanced Functional Properties in Nanoporous Coordination Framework Materials," Chem. Commun., 40th Anniversary Article, 2006, pp. 695-700.

Maspoch et al., "Old Materials with New Tricks: Multifunctional Open-Framework Materials," Chem. Soc. Rev., vol. 36, 2007 (published online Feb. 8, 2007), pp. 770-818.

Pan et al., "Metal-Organic Framework Nanofilm for Mechanically Flexible Information Storage Applications," Adv. Funct. Mater., vol. 25, 2015, pp. 2677-2685.

Reichert et al., "Approaches to Crystallization from Ionic Liquids: Complex Solvents-Complex Results, or, a Strategy for Controlled Formation of New Supramolecular Architecures?" Chem. Commun., 2006 (published online Oct. 3, 2006), pp. 4767-4779.

Rosseinsky, "Recent Developments in Metal-Organic Framework Chemistry: Design, Discovery, Permanent Porosity and Flexibility," Microporous and Mesoporous Materials, vol. 73, 2004 (published online Jun. 17, 2004), pp. 15-30.

Sakata et al., "Shape-Memory Nanopores Induced in Coordination Frameworks by Crystal Downsizing," Science, vol. 339, Jan. 11, 2013, pp. 193-196 (5 pages total).

Shimomura et al., "Guest-Specific Function of a Flexible Undulating Channel in a 7,7,8,8-Tetracyano-p-quinodimethane Dimer-Based Porous Coordination Polymer," J. Am. Chem. Soc., vol. 129, No. 36, 2007(published online Aug. 17, 2007), pp. 10990-10991.

Shimomura et al., "Impact of Metal-Ion Dependence on the Porous and Electronic Properties of TCNQ-Dianion-Based Porous Coordination Polymers," Inorg. Chem., vol. 50, No. 1, 2011 (published online Dec. 2, 2010), pp. 172-177.

Shimomura et al., "TCNQ Dianion-Based Coordination Polymer Whose Open Framework Shows Charge-Transfer Type Guest Inclusion," J. Am. Chem. Soc., vol. 128, No. 51, 2006 (published online Dec. 5, 2006), pp. 16416-16417 (3 pages total).

Sippel et al., "Dielectric Relaxation Processes, Electronic Structure, and Band Gap Engineering of MFU-4-type Metal-Organic Frameworks: Towards a Rational Design of Semiconducting Microporous Materials," Adv. Funct. Mater., vol. 24, 2014 (published online Mar. 18, 2014), pp. 3885-3896.

Susumu et al., "Science of Porous Solid-Future Prospects," Integrated Metal Complex, 2001, pp. 214-218, with English translation (8 pages total).

Talin et al., "Tunable Electrical Conductivity in Metal-Organic Framework Thin-Film Devices," Science, vol. 343, Jan. 3, 2014 (published online Dec. 5, 2013), pp. 66-69 ( 5 pages total).

Tanaka et al., "Effect of a Quaternary Ammonium Salt on Propylene Carbonate Structure in Slit-Shape Carbon Nanopores," J. Am. Chem. Soc., vol. 132, No. 7, 2010 (published online Feb. 1, 2010), pp. 2112-2113.

Wiers et al., "A Solid Lithium Electrolyte via Addition of Lithium Isopropoxide to a Metal-Organic Framework with Open Metal Sites," J. Am. Chem. Soc., vol. 133, Aug. 30, 2011, pp. 14522-14525.

Hasegawa et al., "Resistive switching properties control of the conductive bridge memory based on the Pore Engineering," The 81st Electrochemical Society of Japan Spring Meeting, Mar. 29, 2014, p. 62 with English translation (7 pages total).

Japanese Office Action for counterpart Japanese Application No. 2017-562925, dated Oct. 1, 2019, with English transisfion.

* cited by examiner

ONE-DIMENSIONAL STRUCTURE  TWO-DIMENSIONAL STRUCTURE  THREE-DIMENSIONAL STRUCTURE

MICROSWITCH AND ELECTRONIC DEVICE IN WHICH SAME IS USED

TECHNICAL FIELD OF THE INVENTION

The present invention relates to a porous coordination polymer conductor that includes a conductivity aid and a porous coordination polymer (PCP), a microswitch in which the same porous coordination polymer conductor is used, and an electronic device in which the same microswitch is used.

Priority is claimed on Japanese Patent Application No. 2016-010864 and Japanese Patent Application No. 2016-010865, filed on Jan. 22, 2016, the contents of which are incorporated herein by reference.

RELATED ART

"Switch" used in this specification refers to a mechanism that includes a plurality of stable states capable of changing with a predetermined method and retains data by associating each of the stable states with, for example, "0" or "1". A memory is a kind of a microswitch. In the case of a dynamic random access memory (DRAM) as a kind of the memory, a state where a capacitor is charged and a state where a capacitor is not charged are associated with "1" and "0" to store data. In the case of a flash memory, a state where electric charge is injected into a floating gate and a state where electric charge is not injected into a floating gate are associated with "1" and "0" to store data. These microswitches are widely used as a recording material of a personal computer, a mobile device, or the like, and characteristics of the microswitches play an important role to the extent that the performance of a device in which the microswitch is used is determined depending on the characteristics.

The biggest problem of the microswitch is that existing materials are getting close to the limit on characteristics improvement. In order to improve the characteristic of the microswitch, a refinement method is widely used. As the refinement progresses, the power consumption can be reduced, the response speed can be improved, high functionality can be achieved due to high integration, and the size and weight can be reduced. As the refinement method, in general, a photolithography technique is used. However, this technique has a unique limit value such as a light wavelength, and it is said that a reduction in the size of the currently used microswitch is difficult. In addition, as long as the method of determining whether or not electric charge is inserted into a floating gate is adopted, a problem such as data loss due to the presence of a leak path is unavoidable in the method of the related art in which the determination is performed based on the number of electrons. From this point of view, the improvement of performance is getting close to the limit. As a method of improving the performance, a method of stacking elements has been investigated. However, a highly advanced technique is required for the stacking, which causes problems such as a decrease in yield or an increase in manufacturing costs.

In order to prevent current leakage even after the refinement of the shape, a method of preventing charge leakage using a nitride film can also be used. However, as long as the photolithography technique having a limit on the light wavelength is used, there is a limit on the refinement.

An attempt to develop a high-performance switch using a new mechanism instead of refining an existing material has also been made. Examples of the next-generation flash memory include a magnetoresistive random access memory (MRAM), a phase change random access memory (PRAM), and a resistance random access memory (ReRAM). The MRAM has a complex structure and has a problem such as a low yield or high manufacturing costs. The PRAM performs switching using slow cooling and rapid cooling, and it cannot be said that the speed limit is high in principle. The ReRAM has yet to be put into practice at this point, but is based on a mechanism of forming a metal nanowire. Therefore, a high current can be caused to flow, that is, a stable operation can be expected when the ReRAM is used as a switch. In addition, since the structure is simple, a reduction in manufacturing costs, simple stacking, and the like can also be expected.

The porous coordination polymer (PCP) is a crystalline solid having nanolevel pores that is obtained from a metal ion and an organic ligand and is considered to be used for various applications such as gas adsorption, separation materials, catalysts, sensors, or medical goods due to various combinations of metal ions and organic ligands and the diversity of skeleton structures.

One characteristic of the porous coordination polymer is its network structure. Porous coordination polymers having various structures such as a one-dimensional chain-line aggregate, a two-dimensional square lattice stack, or a jungle gym-shaped three-dimensional structure are known (Non-Patent Document 1). These porous coordination polymers have the diversity of the network structures and have a significantly large variation of metal ions and ligands forming the network structures. Therefore, various chemical properties can be exhibited. Thus, basically, it is highly difficult to estimate physical properties to be exhibited based on the network structure and the metal ion and the ligand forming the network structure, and a method of forming a material using the porous coordination polymer that is considered to be used for various applications has been searched substantially in a groping manner (Non-Patent Documents 2 and 3).

Another characteristic of the porous coordination polymer is the uniformity of a porous structure. The porous coordination polymer is a crystal having a regular repeated structure that is formed from a metal ion and a ligand. Activated carbon is a porous material but has a structure in which pores having different sizes are present in one unit particle (pore size distribution) and the shapes of the pores are various. On the other hand, as described above, pores of the porous coordination polymer are formed of a metal ion and a ligand. Therefore, the pore size is determined depending on the network structure of the metal ion and the ligand and the size of the metal ion and the ligand, and thus the porous coordination polymer is basically formed of pores having the same size. Therefore, the porous coordination polymer has a characteristic in that the pore size distribution is extremely small.

In addition, examples of a porous existing material include zeolite. As with the porous coordination polymer, zeolite is a crystalline material and has an extremely small pore size distribution. However, in general, the pore size of zeolite is larger than that of the porous coordination polymer. Further, a wall that forms the pores of the porous coordination polymer is a molecule and has an extremely small thickness. On the other hand, the thickness of a wall of activated carbon or zeolite has a much larger thickness than the porous coordination polymer. Therefore, the porous coordination polymer has a characteristic in that the porousness is extremely higher (the porosity is higher) than that of activated carbon or zeolite. The development of a gas storage separation material using high gas separation ability that is exhibited by the small pore size distribution, the small pore size, and the high porosity has been studied.

In addition, the PCP is also a material that is extremely easily synthesized. The following is known. The porous material such as zeolite or activated carbon requires a material calcination process and thus requires time and energy. On the other hand, with the porous coordination polymer, powder or a thin film can be easily obtained by mixing a metal ion and a ligand as materials with each other at a temperature similar to room temperature. From this point of view, the porous coordination polymer has a high potential as an industrial material.

The porous coordination polymer is synthesized from a metal ion and a ligand, and the network structure is formed of an organic molecule. Therefore, the conductivity of the material itself is extremely low. The porous coordination polymer is classified as a semiconductor, and the conductivity thereof is extremely low (Non-Patent Document 4).

The porous coordination polymer is applicable to a sensor or the like by being imparted with conductivity. Therefore, various methods of imparting conductivity are reported (Non-Patent Documents 5, 6, and 7).

Many methods of imparting conductivity are present, and a method of imparting conductivity by introducing a material (hereinafter, referred to as "conductivity aid") that improves conductivity into pores of a porous coordination polymer has been investigated. For example, Non-Patent Document 8 discloses a technique of improving conductivity by introducing tetracyanoquinodimethane (TCNQ), which is known as an organic conductor, into a porous coordination polymer film including a copper ion. According to this technique, conductivity can be imparted into the porous coordination polymer. The document describes the following. In a porous coordination polymer $Cu_3(BTC)_2$ (BTC represents 1,3,5-benzenetricarboxylate) used in this document that is abbreviated as HKUST-1, the copper ion is in a tetracoordination state and has a vacant coordination site. Therefore, the vacant coordination site of the copper ion and TCNQ form a complex to form a conductive path. As a result, conductivity is improved. That is, it is considered that this phenomenon is a special phenomenon that occurs only when a special dopant that is electrostatically interactive with the copper ion having a vacant coordination site and has a size to the extent that it can be accommodated in pores and is interactive with the copper ion is used. In addition, this document does not describe the use as a switch such as a memory.

A method of adding TCNQ into pores of a porous coordination polymer including thallium to improve conductivity has also been investigated (Non-Patent Document 9). According to this investigation, conductivity can be imparted to the porous coordination polymer. However, the document does not describe the use as a switch.

A method of improving conductivity by introducing an ionic liquid into pores of a porous coordination polymer has also been investigated (Patent Document 1). According to this investigation, conductivity can be imparted to the porous coordination polymer. However, the document does not clearly describe whether or not a memory effect can be obtained.

A porous coordination polymer including TCNQ as a skeleton has also been developed (Non-Patent Document 10; Non-Patent Document 11; Non-Patent Document 12). An investigation has been performed on various ions, and it is verified that various porous coordination polymers interact with TCNQ such that electrochemical characteristics change. However, the documents do not describe whether or not a switching effect can be obtained.

Regarding a porous coordination polymer having switching characteristics, Patent Document 2 and Non-Patent Document 13 are known. This material realizes switching characteristics in that a state A is switched into another state B due to the addition of gas and the state B is maintained. However, the documents describe only a change in structure caused by the introduction of a gas pressure and do not describe whether or not electrical switching characteristics can be realized.

Regarding a porous coordination polymer into which an ammonium salt that can be considered as an ionic liquid is introduced, Non-Patent Document 18 is known. This document only describes that the ammonium salt is used as a crystallizer but does not clearly describe an effect on physical properties such as conductivity.

Regarding the introduction of an ammonium salt into a porous material, Non-Patent Document 14 is known. According to this investigation, the improvement of gas adsorption is clearly described, but the improvement of conductivity or a memory effect is not clearly described.

Regarding the introduction of a salt into a porous material, Non-Patent Document 15 is known. According to this investigation, the improvement of conductivity is clearly described, and the application to a battery is described. However, a memory effect is not clearly described.

An electrochemical phenomenon called "resistance switching effect" in which the switching of a resistance value can be realized by interposing a thin film of a porous coordination polymer between electrodes and applying a voltage to the electrodes is reported (Non-Patent Document 16). According to this report, a copper ion forming the porous coordination polymer is converted into copper, and a carboxyl group of trimesic acid as a ligand forming the porous coordination polymer is decomposed and vaporized as gas. As a result, an sp2 hybridized orbital is generated, and thus conductivity is imparted. As a specific effect, the porous coordination polymer can be used as a ReRAM. These points are clearly described in the document. That is, according to this method, the conductivity of the porous coordination polymer is improved without adding a dopant, and thus a memory function can be exhibited.

However, in this method, irreversible fractures of the skeleton itself of the porous coordination polymer, for example, disappearance of the copper ion forming the porous coordination polymer from a skeleton, precipitation of the copper ion on the electrodes, and decomposition of the carboxyl group of the ligand forming the porous coordination polymer occur. The skeleton of the porous coordination polymer is a material that forms nanopores of the porous coordination polymer. Due to these fractures, various unpreferable changes as a conductive material, for example, a change in strength as a material, a change in pore size, a change in pore size distribution, and a change in conductivity corresponding to the fracture occur. Further, it is difficult to completely control the material fracture phenomena. As a result, a dispersion in material characteristics occurs, and thus there are problems in the refinement of a switch, the micronization and stabilization of an operating current, and material deterioration over time. This way, the technique disclosed in this document relates to a ReRAM in which the changes of the constituent material (the porous coordination polymer) itself, that is, the dissociation and migration of an element forming the porous coordination polymer is used, in which the material fractures and the like occur essentially. Therefore, the above-described defects are essentially unavoidable. In addition, the electrode structure disclosed in this document is a sandwich structure formed of the same metal, and characteristics of a case where two metals are used are not disclosed in the document.

The concept of the memory in which pores are used is initially disclosed in Non-Patent Document 17, and the history thereof is extremely short. Even in Non-Patent Document 17, a grain boundary of a polycrystalline thin film is merely considered as a pore. There is a report regarding a conductive-bridge random access memory (CB-RAM) in which a nanoporous material is used, and there is a technique in which an alumina porous material and a silica porous material are used. However, these porous materials have an extremely large pore size distribution, and thus there is a dispersion in operating current or the like. In addition, this is a method in which manufacturing itself is very difficult due to an anodic oxidation process. In addition, there is no reported case in which a CB-RAM is manufactured using this method.

In the memory in which pores are used, it is preferable that one pore is used as one memory cell from the viewpoint of high density. However, the control of a pore size and a pore spacing is the key to practical application. From this point of view, the use of a porous material having precisely controlled pores can be considered. However, there is a problem such as thinning of zeolite, and there is no report of a CB-RAM using zeolite at this time.

For example, the porous coordination polymer has the following advantageous points: (1) the pore size distribution is extremely small (an operation dispersion is small); (2) the pore size is small (the cell size is small, and the high density can be achieved); and (3) thinning is easy. The CB-RAM has a structure of electrode A/memory layer/electrode B, in which the electrode A is formed of a metal that is electrochemically active and is easily ionized, and the electrode B is formed of a metal that is electrochemically stable. The resistance switches between low resistance and high resistance by applying a voltage between the electrodes such that an atom forming the electrode A is diffused into the memory layer and a filament bridge is formed or broken. By using the porous coordination polymer for the memory layer, the improvement of the performance of the CB-RAM using the desirable characteristics (1) to (3) can be expected.

In the CB-RAM, the resistance switches between low resistance and high resistance by forming or breaking a filament formed of the electrode forming metal due to the diffusion of the electrode forming metal into the memory layer. Thus, there are many cases in which the acceleration of the metal diffusion (or metal ion diffusion) caused by Joule's heat is essential in order to perform switching. However, in the porous coordination polymer or the CB-RAM, the conductivity is low, and an increase in temperature caused by Joule's heat is extremely small. Therefore, it is difficult to form a metal nanowire, that is, a filament, and there are very little reported cases related to the ReRAM in which the irreversible fractures of the porous coordination polymer occur. However, there is no report relating to the CB-RAM in which the porous coordination polymer is used.

PRIOR ART DOCUMENT

Patent Document

[Patent Document 1] PCT International Publication No. WO2013/161452
[Patent Document 2] Japanese Patent No. 4834048

Non-Patent Document

[Non-Patent Document 1] Kitagawa Susumu, Integrated Metal Complex, Kodansha Scientific Ltd., pp. 214-218, 2001
[Non-Patent Document 2] Yaghi et al., Science (2008) 939
[Non-Patent Document 3] Rosseinsky et al., Microporous and mesoporous Mater. 73, (2004), 15
[Non-Patent Document 4] Volkmer et al., Adv. Funct. Mater. (2014) 3885
[Non-Patent Document 5] Veciana/maspoc et al., Chem. Soc. Rev. (2007)36, 770
[Non-Patent Document 6] Janiak et al., Dalton trans. (2003) 2781
[Non-Patent Document 7] Kepert, C, J et al., Chem. Commun. (2006) 695
[Non-Patent Document 8] Allendorf et al., Science (2014) 343, 66
[Non-Patent Document 9] Dunbar et al., Angew. Chem. Int. Ed. Eng. (2011) 6543
[Non-Patent Document 10] Kitagawa et al., Inorg. Chem. (2011) 172
[Non-Patent Document 11] Kitagawa et al., J. Am. Chem. Soc. (2006) 16416
[Non-Patent Document 12] Kitagawa et al., J. Am. Chem. Soc. (2007) 10990
[Non-Patent Document 13] Sakata et al., Science 2013, 339, 193-196.
[Non-Patent Document 14] Kaneko et al., J. Am. Chem. Soc. (2010) 2112
[Non-Patent Document 15] Long et al., J. Am. Chem. Soc. (2011) 14522
[Non-Patent Document 16] Li et al., Adv. Funct. Mater. (2015) 2677
[Non-Patent Document 17] S. Hasegawa, K. Kinoshita, S. Tsuruta, S. Kishida, ECS Trans. 2013, 50, 61.
[Non-Patent Document 18] Rogers et al., Chem. Commun. (2006) 4767

DISCLOSURE OF THE INVENTION

Problems to be Solved by the Invention

An object of the present invention is to provide a microswitch that is formed of a new porous coordination polymer conductor and two electrode metals, the porous coordination polymer conductor being obtained by adding a conductivity aid to a porous coordination polymer. In addition, another object of the present invention is to provide a memory in which the same switch is used.

Means for Solving the Problem

The present invention is as follows.
(1) A microswitch including:
a first electrode;
a second electrode; and
a porous coordination polymer conductor,
in which the porous coordination polymer conductor is represented by the following Formula (1), and
a metal forming the first electrode and a metal forming the second electrode have different oxidation-reduction potentials, $$[ML_x]_n(D)_y \tag{1},$$

where M represents a metal ion selected from group 2 to group 13 elements in a periodic table, L represents a ligand that has two or more functional groups capable of coordination to M in a structure of L and is crosslinkable with two M's, D represents a conductivity aid that includes no metal element, x represents 0.5 to 4, y represents 0.0001 to 20 with respect to x as 1, n represents the number of repeating units of a constituent unit represented by $[ML_x]$, and n represents 5 or more.

(2) The microswitch according to (1),
in which D represents a compound having a carbon-carbon multiple bond in a molecule and having a sulfur or nitrogen atom.

(3) The microswitch according to (1),
in which D represents a compound having a carbon-carbon multiple bond in a molecule and having an electron-withdrawing group or an electron-donating group bonded to the carbon-carbon multiple bond, or an aromatic compound having an extended conjugated system.

(4) The microswitch according to (2) or (3),
in which D represents an acceptor compound selected from the group consisting of tetracyanoethylene, tetracyanoquinodimethane, benzoquinone, and a derivative thereof.

(5) The microswitch according to (2) or (3),
in which D represents a donor compound selected from tetrathiafulvalene and a derivative thereof.

(6) The microswitch according to any one of (1) to (5),
in which the porous coordination polymer conductor includes two or more D's.

(7) The microswitch according to (6),
in which at least one of the two or more D's is an organic conductivity aid that is formed of an organic material having electric charge in a molecule.

(8) The microswitch according to (7),
in which the organic conductivity aid is selected from the group consisting of a quaternary ammonium salt, a phosphonium salt, an amine-alkali metal ion complex, an imidazolium salt, a pyridinium salt, and a sulfonium salt.

(9) The microswitch according to any one of (1) to (8),
in which a D content is 0.001 to 30 mass % with respect to the porous coordination polymer conductor.

(10) The microswitch according to any one of (1) to (9),
in which M represents a divalent, trivalent, or tetravalent metal ion selected from the group consisting of chromium, manganese, iron, cobalt, nickel, copper, zinc, a rare earth element, and zirconium.

(11) The microswitch according to any one of (1) to (9),
in which L represents an aromatic compound having two or more carboxyl groups in a molecule.

(12) The microswitch according to any one of (1) to (9),
in which L represents a non-aromatic compound having two or more carboxyl groups in a molecule.

(13) The microswitch according to (11),
in which L represents an aromatic compound having two or more coordinating nitrogen atoms in a molecule.

(14) The microswitch according to (12),
in which L represents a non-aromatic compound having two or more coordinating nitrogen atoms in a molecule.

(15) The microswitch according to any one of (1) to (9),
in which M is selected from the group consisting of magnesium, aluminum, calcium, scandium, manganese, iron (II), iron (III), cobalt, nickel, copper, zinc, zirconium, ruthenium, rhodium, palladium, silver, cadmium, indium, and rhenium, and
L is selected from the group consisting of substituted or unsubstituted terephthalic acid, isophthalic acid, 2,6-naphthalenedicarboxylic acid, 2,7-naphthalenedicarboxylic acid, 4,4'-biphenyldicarboxylic acid, trimesic acid, substituted or unsubstituted 4,4'-bipyridine, 1,4-(4-pyridyl)benzene, and substituted or unsubstituted imidazole.

(16) The microswitch according to any one of (1) to (15),
in which a difference between the oxidation-reduction potential of the metal forming the first electrode and the oxidation-reduction potential of the metal forming the second electrode is 0 eV to 5.0 eV.

(17) The microswitch according to any one of (1) to (16),
in which the metal forming the first electrode is a metal selected from the group consisting of Au, Pt, W, Ru, In, Rh, and silicon, and
the metal forming the second electrode is a metal selected from the group consisting of Cu, Ag, Zn, Co, Mn, and Al.

(18) The microswitch according to (17),
in which the metal forming the first electrode is selected from the group consisting of indium tin oxide (ITO: Tin-doped $In_2O_3$), titanium oxide doped with Nb, zinc oxide doped with Ga or Al, and $SrTiO_3$, $SrRuO_3$, $RuO_2$, or $IrO_2$ doped with Nb.

(19) An electronic device that is configured using the microswitch according to any one of (1) to (18).

(20) A method of manufacturing a microswitch for a CB-RAM, the method including:
forming a porous coordination polymer by mixing a metal ion and a ligand with each other;
bringing the porous coordination polymer into contact with first and second electrodes; and
forming a porous coordination polymer conductor by mixing the porous coordination polymer in contact with the first and second electrodes and a conductivity aid with each other,
in which the metal ion is selected from group 2 to group 13 elements in a periodic table,
the ligand has two or more functional groups capable of coordination to the metal ion in a structure of the ligand and is crosslinkable with two metal ions,
the conductivity aid is a material that includes no metal element, and
a metal forming the first electrode and a metal forming the second electrode have different oxidation-reduction potentials.

(21) A method of manufacturing a microswitch, the method including:
forming a porous coordination polymer conductor by mixing a metal ion, a ligand, and a conductivity aid with each other; and
bringing the porous coordination polymer conductor into contact with first and second electrodes,
in which the metal ion is selected from group 2 to group 13 elements in a periodic table,
the ligand has two or more functional groups capable of coordination to the metal ion in a structure of the ligand and is crosslinkable with two metal ions,
the conductivity aid is a material that includes no metal element, and
a metal forming the first electrode and a metal forming the second electrode have different oxidation-reduction potentials.

Effects of the Invention

The microswitch according to the present invention formed of the porous coordination polymer conductor and the two metals can be used as a memory. In addition, the present invention is applicable to a random access memory, a storage class memory; an integrated circuit (memory chip, LSI), a storage device (for example, a SSD, a SD card, an USB memory), or a memory circuit having a learning function, which utilizes the above memory; a circuit switching switch for a field programmable gate array (FPGA); or other devices (sensors).

The microswitch that is formed of the porous coordination polymer conductor according to the present invention realizes micronization of various devices formed from the microswitch, high integration, power saving, improvement of functionality due to the improvement of the response speed, improvement of flexibility using the characteristics of an organic material, a reduction in weight due to thinning, a simple process due to the easiness of material synthesis, a reduction in costs, improvement of versatility, and the like.

The microswitch according to the present invention can be used for a programmable circuit. The programmable circuit is a circuit that is programmable by a user according to the purpose, and specific examples thereof include a field programmable gate array (FPGA) circuit that is a gate array in which a user can design a unique logic circuit. The programmable circuit can be used for digital signal processing, software wireless systems, avionics, and the like. By using the microswitch according to the present invention, the refinement and performance can be further improved.

The microswitch according to the present invention can be used for a memory chip. The memory chip is a device in which memory elements are integrated. The memory chip is used as a storage element of a personal computer, a mobile device, or the like. By using the microswitch according to the present invention, the high integration due to refinement and the functionality can be further improved.

A control device can be configured using the memory chip in which the microswitch according to the present invention is used. The control device is, for example, a microcomputer and is used for controlling home electronics and the like. By using the present invention, the high integration due to refinement and the functionality can be further improved.

An LSI can be configured by using the microswitch according to the present invention. The LSI is a large scale integrated circuit and is widely used for a control device or the like. Currently, a high-quality oxide film can be easily formed, and a p-type and an n-type can be easily selectively used. Therefore, a silicon-based LSI is used in practice, an alternative technique is not substantially present. However, by using the microswitch according to the present invention, an LSI formed of a PCP alone can be realized as with a Si/silicon oxide film. The reason for this is as follows. Originally, the PCP has semiconductor characteristics, and a carrier type and a carrier density can be controlled by doping. Therefore, a basic circuit element such as a diode and a transistor can be realized, and a PCP-based storage device that is inevitable for realizing an LSI can also be provided using the microswitch according to the present invention. Further, with the PCP, the formation of an ultra-thin film, the formation of a fine circuit, and the like are simple, and thus a doping process is simple and doping can be finely performed. Therefore, a Si-substituted LSI can be realized using the microswitch according to the present invention.

A sensor can be configured by using the microswitch according to the present invention. It is known that various solvents, water, and the like are adsorbed on the pores of the PCP. Further, it is also known that characteristics of the PCP change after the adsorption. According to this principle, a sensor can be developed using the fact that conductivity and a switching voltage change depending on a solvent, a gas molecule, light, or the like.

A neuro-computer having a learning function can be configured by using the microswitch according to the present invention. The neuro-computer refers to a computer having a learning function in which, by mimicking neurogenesis as a storage method of an organism, the dynamic formation of an electric circuit including the formation of a new circuit and the elimination of an unnecessary circuit can be realized according to the preference of a user. The neuro-computer is a device that can autonomously realize a function corresponding to the preference of a user without the user actively executing a program. The microswitch according to the present invention has characteristics: that, in a case where the formed filament is not used, the metal forming the filament is gradually diffused and thinned; and in a case where the formed filament is used, the metal forming the filament is thickened. Therefore, a neuro-computer function similar to the neurogenesis can be realized.

An artificial intelligence can be configured using the neuro-computer in which the microswitch according to the present invention is used. The artificial intelligence refers to a machine that can artificially realize intelligence similar to a human. By using the neuro-computer, the sophistication of the artificial intelligence autonomously progresses according to the preference of a user, and the artificial intelligence is applicable to a robot or the like having a pattern recognition ability.

By using the microswitch according to the present invention, a flexible and light-weight various functions or devices can be configured. The flexibility is advantageous in that a wearable function or the like can be exhibited without being limited to the shape. The microswitch according to the invention can be made to be flexible and lightweight by having the flexibility, thinness, and lightness of an organic material.

EMBODIMENTS OF THE INVENTION

Figure 1:
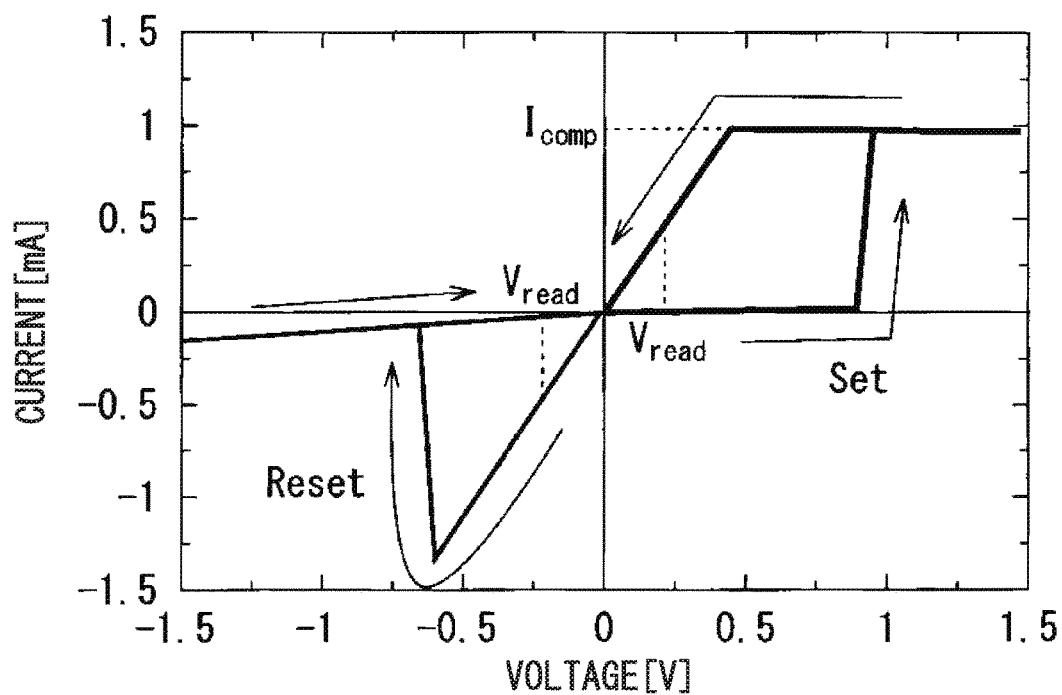
FIG. 1 is a graph illustrating evaluation of data writing and erasing characteristics and data retention characteristics of a memory element prepared from a microswitch according to the present invention.

A microswitch according to the present invention is configured by adding a conductivity aid to a porous coordination polymer to obtain a porous coordination polymer conductor and interposing the obtained porous coordination polymer conductor between electrodes formed of two metals having electrochemically different oxidation-reduction potentials (electrodes formed of a metal that is electrochemically active and a metal that is electrochemically inactive).

As a result, switching between high resistance and low resistance can be electrically performed on purpose.

In the present invention, a circuit is configured using the porous coordination polymer conductor and the two metals having different oxidation-reduction potentials. In addition, using diffusion of the electrode metals in nanopores of the porous coordination polymer conductor, a state where the electrodes are connected to each other through the diffused electrode metals and a state where the connection between the electrodes is broken are associated with "1" and "0", respectively. As a result, the function of the microswitch can be realized. With this configuration, the function of the microswitch can be realized without the occurrence of the irreversible fracture of the porous coordination polymer conductor. Therefore, the microswitch according to the present invention is desirable in terms of characteristic such as the refinement of the switching function, the micronization and stabilization of an operating current, or material deterioration over time.

The microswitch according to the present invention can be used as a nonvolatile memory such as a ReRAM. In a ReRAM and a CB-RAM, the switching of resistance can be realized by forming or breaking a conductive path. Therefore, the principles of a ReRAM and a CB-RAM seem to be the same. However, it is reported that the conductive path of a ReRAM is configured due to oxygen deficiency. On the other hand, the conductive path of a CB-RAM is configured due to a metal atom. Therefore, current transport characteristics are desirable, and a CB-RAM is also applicable to a circuit switching switch or the like for a field programmable gate array (FPGA).

Further, the present invention establishes a technique of locally doping a p-type or n-type dopant and is also applicable to not only a memory but also an LSI technique of forming a circuit element such as a transistor or a diode on a PCP substrate. In order to realize this technique, an ink jet technique or the like can be used.

The present inventors repeatedly conducted a thorough investigation in order to solve the above-described problems, and found that a function of a microswitch can be realized by adding an organic conductivity aid formed of an organic material having electric charge to a porous coordination polymer to prepare a porous coordination polymer conductor and bringing the porous coordination polymer conductor into contact with two electrode metals having different oxidation-reduction potentials to configure a circuit, thereby completing the present invention. In addition, the present inventors found that the microswitch can function as a memory, thereby completing the present invention.

A microswitch including the porous coordination polymer conductor according to the present invention is represented by the following structure (2), is formed by crosslinking a ligand L and a metal ion M, and is a microswitch including a porous coordination polymer conductor having pores with a size to which a conductivity aid D is added, a first electrode, and a second electrode.

First Electrode|[$ML_x$]$_n$($D$)$_y$|Second Electrode (2)

(In the formula, M represents a metal ion selected from group 2 to group 13 elements of a periodic table, L represents a ligand that has two or more functional groups capable of coordination to M in a structure of L and is crosslinkable with two M's, D represents a conductivity aid that can improve the conductivity of the porous coordination polymer, x represents 0.5 to 4, y represents 0.0001 to 2 with respect to x as 1, n represents the number of repeating units of a constituent unit represented by [$ML_x$], and n represents 5 or more)

The porous coordination polymer conductor used in the present invention has a unique characteristic in that an electric resistance value between the first electrode and the second electrode changes by applying a driving voltage or a current thereto and has two or more different states. For example, referring to a voltage sweep-current measurement diagram of FIG. 1, a resistance value at a voltage of Set and a resistance value at a voltage of Reset are different from each other, and two or more resistance states are present in the voltage sweep-current measurement curve.

Regarding an operation mechanism of the switching element according to the present invention, during the voltage application, the metal of the first electrode is ionized and diffused into the pores of the PCP, and this ion accepts an electron from the second electrode and is reduced. As a result, a metal filament is formed between the electrodes. As a reverse reaction, the metal filament that is temporarily formed is oxidized into ions by voltage application and disappears. This way, the switching function is realized. Accordingly, for the formation and breakage of the metal filament, it is necessary to diffuse the metal ion of the first electrode metal into the pores. To that end, it is important to accelerate the diffusion of the metal ion due to an increase in temperature caused by the generation of Joule's heat by using the PCP having a pore size into which the metal ion can be diffused and further adding the conductivity aid to the PCP to increase the carrier density.

In addition, a solvent in the pores has a large effect on a voltage (that is, a switching voltage) required for the ionization of the inactive electrode and the diffusion of the metal ion. Therefore, it is necessary to select an appropriate solvent. A shape of the filament has an effect on the switching function. Therefore, it is important to appropriately select the metal kind of the PCP, the kind of the ligand, the pore shape, and the kind and amount of the conductivity aid, which can have an effect on the shape of the filament.

In addition, the conductivity aid having a relatively high aspect ratio in the pores of the porous coordination polymer conductor rotates or changes the position in the pores during voltage application such that the effective volume in the pores changes. Due to this change in the effective pore volume and the diffusion of the metal ion of the electrode into the pores during voltage application and the reduction thereof, the metal nanowire is formed. Due to the reverse reaction of the above reaction, the metal nanowire disappears. As a result, it is considered that the switching effect is exhibited.

The porous coordination polymer conductor used in the microswitch according to the present invention has a network structure. This network structure is formed of the metal ion M and the ligand L. Regarding the dimensionality of the network structure, any one of a one-dimensional structure in which linear porous coordination polymer conductors regularly aggregate, a surface-shaped two-dimensional network structure, and a jungle gym-shaped three-dimensional network structure can be adopted. An actual material is a material in which unit structures aggregate irrespective of these dimensions and is a crystalline or amorphous solid. In the case of the one-dimensional structure or the two-dimensional structure, material flexibility is exhibited. In the case of the three-dimensional structure, the robustness of the material is exhibited. The basic network can be selected according to the intended use.

The porous coordination polymer conductor used in microswitch according to the present invention is a porous material. Therefore, when coming into contact with an organic molecule of water, alcohol, ether, or the like, the porous coordination polymer conductor includes water or an organic solvent in the pores, and may be changed into a composite material represented by Formula (3).

First Electrode|[$ML_x$]$_n$($D$)$_y$($G$)$_z$|Second Electrode    (3)

(In the formula, M represents a metal ion selected from group 2 to group 13 elements of a periodic table, L represents a ligand that has two or more functional groups capable of coordination to M in a structure of L and is crosslinkable with two M's, D represents a conductivity aid that can improve the conductivity of the porous coordination polymer, x represents 0.5 to 4, y represents 0.0001 to 2 with respect to x as 1, G represents a solvent molecule or a water molecule in air used for synthesis described below which is so-called a guest molecule, z represents 0.0001 to 4 with respect to the metal ion as 1, n represents the number of repeating units of a constituent unit represented by [$ML_x$], and n represents 5 or more)

However, the guest molecule represented by G in the composite material is weakly bonded to the porous coordination polymer conductor, and is easily removed by drying under reduced pressure when being used for a switch and returns to the original material represented by Formula (2). Therefore, basically, even the form represented by Formula (3) can be considered as the same microswitch as the microswitch according to the present invention. In addition, in a case where G represents an amount of a material that has no effect on physical properties of the microswitch, the microswitch can be used in a state where it includes G On the other hand, in a case where G represents, for example, a water molecule that assists the migration of an ionic material in the pores, the switch can be used in a state where it actively includes G <Synthesis Method of Porous Coordination Polymer Conductor>

The porous coordination polymer conductor according to the present invention can be manufactured as follows. The porous coordination polymer conductor represented by Formula (1) [$ML_x$]$_n$($D$)$_y$ can be obtained by adding the conductivity aid D to the porous coordination polymer represented by Formula (4).

[$ML_x$]$_n$    (4)

(In the formula, M, L, and x are as described above, and n represents the number of repeating units of a constituent unit represented by [$ML_x$] and n represents 5 or more)

As the porous coordination polymer represented by Formula (4), an existing porous coordination polymer synthesized using an existing method can be used. Specifically, the porous coordination polymer can be obtained by a reaction of a metal ion and a ligand in a solution or a solid phase.

In a method of preparing the porous coordination polymer, there are various conditions, and the conditions cannot be uniquely determined. In general, examples of a metal ion source include a metal salt (for example, copper nitrate), a metal (for example, copper), and a metal oxide (for example, copper oxide), and examples of the ligand include an organic compound having two or more coordination sites, for example, an aromatic carboxylic acid such as terephthalic acid or trimesic acid, an aliphatic carboxylic acid such as fumaric acid or citric acid, a compound having an aromatic nitrogen functional group such as imidazole or 4,4'-bipyridine, or a substituted compound thereof. Examples of reaction conditions include a solution method using a solvent such as water, alcohol, or DMF and a solid phase method in which a solution is not used. For example, the porous coordination polymer can be synthesized based on documents such as Cheetham et al., Angew. Chem. Int. Ed. (2010) 9640, Yaghi et al., Science (2009) 855, or a pamphlet of Sigma-Aldrich Co., Inc., "Materials Matters Basics 7".

<Method of Adding Conductivity Aid to Porous Coordination Polymer>

The porous coordination polymer conductor can be obtained by adding the conductivity aid D to the porous coordination polymer represented by Formula (4). Examples of the addition method include an addition method of dissolving a material including the porous coordination polymer and the conductivity aid in a solvent, a method of dipping the porous coordination polymer in a solution in which the conductivity aid is dissolved such that the solvent in which the conductivity aid is dissolved is incorporated into the pores, an addition method of mixing the porous coordination polymer and the conductivity aid with each other in a solid phase, an addition method of mixing the conductivity aid as a liquid and the porous coordination polymer with each other without using a solvent, an addition method of heating the conductivity aid to be vaporized as gas and exposing the gas to the porous coordination polymer, and an addition method of causing a material including the metal ion and the ligand forming the porous coordination polymer to react with the conductivity aid in a liquid or a solid phase.

The addition method of dissolving the conductivity aid in a solution is advantageous in that it can be performed under mild conditions. The addition method in a solid phase is advantageous in that a solvent is not necessary. In addition, the addition method of vaporizing the conductivity aid is advantageous in that the conductivity aid is densified during the vaporization. The addition method of causing a material including the metal ion, the ligand material, and the conductivity aid forming the porous coordination polymer to react with the conductivity aid in a liquid or a solid phase is advantageous in that the conductivity aid can be added to the porous coordination polymer having a smaller pore window than the conductivity aid. In consideration of the above-described advantageous effects, the addition method can be selected according to the kinds of the porous coordination polymer and the conductivity aid to be used and the intended use of the obtained material.

<Conductivity Aid D>

In order to impart conductivity to the porous coordination polymer having low conductivity, the addition of the conductivity aid D is essential. Examples of a material that can impart conductivity to the porous coordination polymer include a material that undergoes self oxidation-reduction, for example, ferrocene. However, the material having oxidation-reduction properties is not preferable because it interacts with a metal nanowire that is formed in the pores of the porous coordination polymer such that the switching function may deteriorate. Therefore, a donor and/or acceptor material having a carbon-carbon multiple bond in a molecule and having a heteroatom such as sulfur or nitrogen, or an organic material having electric charge such as tetramethylammonium tetrafluoroborate is preferable.

In addition, the conductivity aid D includes no metal element. In a case where a material including a metal element, for example, ferrocene is used as the conductivity aid D, the metal element inhibits the formation of the metal wire and the breakage of the formed wire, which is not preferable.

Examples of the material that can be used as the conductivity aid D include a material having a carbon-carbon multiple bond in a molecule and having a heteroatom such as sulfur or nitrogen.

Other examples of the material that can be used as the conductivity aid D include a conductivity aid having a carbon-carbon multiple bond in a molecule and having an electron-withdrawing group or an electron-donating group bonded to the carbon-carbon multiple bond, and an aromatic compound having an extended conjugated system. Examples of the electron-withdrawing group or the electron-donating group include a cyano group, a carbonyl group, an amino group, an imino group, and a sulfur atom. The aromatic compound having an extended conjugated system refers to a material that can be considered as an aromatic compound in which at least seven or more double bonds or triple bonds are conjugated and the Huckel's rule is satisfied. This material is capable of electron delocalization due to the presence of the plural conjugated double bonds or triple bonds. Examples of the aromatic compound having an extended conjugated system include a fullerene.

It is considered that the carbon-carbon multiple bond imparts conductivity to the porous coordination polymer through an interaction with the metal ion M included in the porous coordination polymer or the heteroatom having polarity such as oxygen or nitrogen included in the ligand L. In addition, it is considered that the heteroatom such as sulfur or nitrogen in the conductivity aid causes polarization of electron in the carbon-carbon multiple bond of the conductivity aid and strengthens the interaction between the porous coordination polymer and the conductivity aid.

Specific examples of the conductivity aid D include, as a material that provides a donor molecule, bis(ethylenedithio)tetrathiafulvalene, bis(methylenedithio)tetrathiafulvalene, bis(trimethylenedithio)tetrathiafulvalene, bis(ethylenedithio)tetrathiafulvalene-$d_8$, dimethyltetrathiafulvalene, formyltetrathiafulvalene, a phthalocyanine, tetrathiafulvalene, tetrakis(methylthio)tetrathiafulvalene, tetrakis(pentylthio)tetrathiafulvalene, tetrakis(dimethylamino)ethylene, a tris(tetrathiafulvalene)bis(tetrafluoroborate) complex, tetrakis(ethylthio)tetrathiafulvalene, a tetrathiafulvalene-7,7,8,8-tetracyanoquinodimethane complex, and 2,3,6,7-tetrakis(2-cyanoethylthio)tetrathiafulvalene.

Among these materials, from the viewpoint that the conductivity aid can be added to the porous coordination polymer having a small molecule and pores with various sizes, for example, bis(ethylenedithio)tetrathiafulvalene, bis(methylenedithio)tetrathiafulvalene, tetrakis(dimethylamino)ethylene, or a tetrathiafulvalene-7,7,8,8-tetracyanoquinodimethane complex can be preferably used. In a case where the porous coordination polymer includes a copper ion, an interaction between tetracyanoquinodimethane and the copper ion is strengthened, the mobility of the conductivity aid in the pores deteriorates, and thus the response speed of the switch decreases. Therefore, in a case where the porous coordination polymer includes a copper ion, it is preferable that a conductivity aid other than tetracyanoquinodimethane is used.

Specific examples of the conductivity aid D include, as a material that provides an acceptor molecule, a substituted or unsubstituted 1,4-benzoquinone, a bis(tetrabutylammonium) bis(maleonitriledithiolato) nickel (II) complex, 1,3-bis(dicyanomethylidene)indane, bis(tetrabutylammonium) bis(1,3-dithiole-2-thione-4,5-dithiolato)palladium (II), bis(tetrabutylammonium) tetracyanodiphenoquinodimethanide, a substituted or unsubstituted fullerene, a tetracyanoquinodimethane such as 2,5-dimethyl-7,7,8,8-tetracyanoquinodimethane, 7,7,8,8-tetracyanoquinodimethane, tetrafluorotetracyanoquinodimethane, or 11,11,12,12-tetracyanonaphtho-2,6-quinodimethane, tetracyanoethylene, and 3,3',5,5'-tetra-tert-butyl-4,4'-diphenoquinone.

Among these materials, from the viewpoint that the conductivity aid can be added to the porous coordination polymer having a small molecule and pores with various sizes, for example, a substituted or unsubstituted 1,4-benzoquinone, a bis(tetrabutylammonium) bis(maleonitriledithiolato) nickel (II) complex, 1,3-bis(dicyanomethylidene)indane, bis(tetrabutylammonium) tetracyanodiphenoquinodimethanide, 2,3-dichloro-5,6-dicyano-1,4-benzoquinone, 2,5-dimethyl-7,7,8,8-tetracyanoquinodimethane, tetracyanoethylene, or 7,7,8,8-tetracyanoquinodimethane can be preferably used.

In particular, the conductivity aid having a tetrathiafulvalene skeleton is desirable from the viewpoint of improving the durability of the material. In particular, tetracyanoethylene and a tetracyanoquinodimethane type conductivity aid having a substituted functional group are desirable from the viewpoint of a high response speed.

In addition, it is also preferable that an organic material having electric charge such as an ionic liquid is added to the conductivity aid D. Examples of the organic material having electric charge include: a quaternary ammonium salt such as tetraethylammnonium tetrafluoroborate; a phosphonium salt such as tributylhexadecylphosphonium bromide; an amine-alkali metal ion complex such as sodium dicyanamide; an imidazolium salt such as 1-butyl-3-methylimidazolium bromide, 1-butyl-3-methylimidazolium iodide, or 1-ethyl-3-methylimidazolium p-toluenesulfonate; a pyridinium salt such as 1-aminopyridinium iodide or 1,1'-di-n-octyl-4,4'-bipyridinium dibromide; a piperidinium salt such as 1-butyl-1-methylpiperidinium bromide; and a sulfonium salt such as triethylsulfonium bis(trifluoromethanesulfonyl)imide. In addition, from the viewpoint that an ionic interaction with the conductivity aid D can be improved and the conductivity performance can be improved, a pyridinium salt, an ammonium salt, a sulfonium salt, or a phosphonium salt can be preferably used. In particular, the ammonium salt or pyridinium salt type conductivity aid is desirable from the viewpoint of the durability of the memory function.

As the conductivity aid D, a mixture of two or more kinds can be used according to the intended use.

The conductivity aid D content is preferably 0.001 to 30 mass % and more preferably 0.005 to 15 mass % with respect to the porous coordination polymer conductor.

<Metal Ion M>

The porous coordination polymer [$ML_x$] used in the microswitch according to the present invention is formed of the metal ion M and the ligand L. The selection of the metal ion M has an effect on switching characteristics.

The metal ion M forming the porous coordination polymer used for the microswitch according to the present invention is a divalent, trivalent, or tetravalent metal ion selected from the group consisting of group 2 to group 13 elements in the periodic table. From the viewpoint of forming the porous coordination polymer having high stability, for example, chromium, manganese, iron, cobalt, nickel, copper, zinc, cerium, scandium, zirconium, ruthenium, rhodium, cadmium, or rhenium is preferable. From the viewpoint of improving affinity to the conductivity aid and easily increasing conductivity, iron, cobalt, nickel, copper, zinc, or zirconium is preferable. From the viewpoint of increasing the response speed of the memory effect, chromium, manganese, iron, cobalt, nickel, zinc, cerium, scandium, zirconium, ruthenium, rhodium, cadmium, or rhenium can be preferably used. From the viewpoint of high durability of the microswitch (switching element), iron, cobalt, nickel, zinc, or zirconium is preferable. As the metal ion M, a mixture of two or more kinds may also be used.

In a case where the metal ion M is a copper ion and the active metal of the electrode is copper, the copper ion eluted from the electrode metal is inhibited from forming a nanowire by the copper ion in the PCP, and the conductivity tends to deteriorate. Therefore, a metal ion other than copper is preferable.

The porous coordination polymer used in the microswitch according to the present invention is formed of the metal ion M and the ligand L. The kind of the ligand L has an effect on switching characteristics. Hereinafter, this point will be described.

<Ligand L>

The ligand L has two or more functional groups capable of coordination to the metal ion M in a structure of the ligand and is crosslinkable with two metal ions M.

Examples of the ligand material include: a dicarboxylic acid such as substituted or unsubstituted terephthalic acid, isophthalic acid, 2,6-naphthalenedicarboxylic acid, or 4,4'-biphenyldicarboxylic acid; a tricarboxylic acid such as substituted or unsubstituted trimesic acid, 1,2,4-naphthalenetricarboxylic acid, or 2,5,7-naphthalenetricarboxylic acid; a tetracarboxylic acid such as substituted or unsubstituted 1,2,4,5-benzenetetracarboxylic acid or 1,4,5,8-naphthalenetetracarboxylic acid; a bipyridyl such as substituted or unsubstituted 4,4'-bipyridine or 1,4-(4-pyridyl)benzene; a substituted or unsubstituted imidazole; and a benzimidazole.

From the viewpoint of forming the porous coordination polymer having high stability, a dicarboxylic acid such as substituted or unsubstituted terephthalic acid, isophthalic acid, 2,6-naphthalenedicarboxylic acid, or 4,4'-biphenyldicarboxylic acid, or a bipyridyl such as substituted or unsubstituted 4,4'-bipyridine or 1,4-(4-pyridyl)benzene can be preferably used. As the ligand, a mixture of two or more kinds may also be used.

A ligand material having two carboxyl groups bonded to a benzene ring, for example, terephthalic acid or isophthalic acid is preferable from the viewpoints of decreasing the electron density of the benzene ring, decreasing the interaction with the metal ion, improving the diffusion rate of the metal ion, the growth of the nanowire, and the disappearance rate, and improving the response speed.

A combination of an acidic ligand material and a basic ligand material having different sizes, for example, a combination of biphenyldicarboxylic acid and 1,4-diazabicyclo [2.2.2] octane (DABCO) is preferable from the viewpoint of easily obtaining the porous coordination polymer having anisotropic pores.

Figure 2:
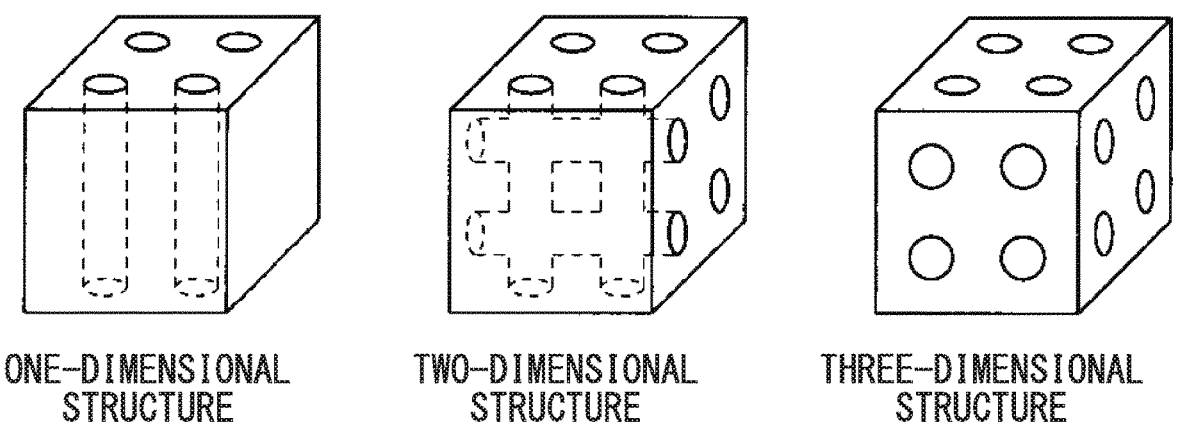
FIG. 2 is a schematic diagram illustrating forms of pores present in a porous coordination polymer.

In the pores of the porous coordination polymer to be formed, three types of dimensional structures including a one-dimensional structure, a two-dimensional structure, and a three-dimensional structure are present. FIG. 2 is a conceptual diagram of the structures. Assuming that a crystal lattice is a cube, through-holes present in opposite surfaces are one-dimensional pores, through-holes present in four surfaces are two-dimensional pores, and through-holes present in all the six surfaces are three-dimensional pores. The dimensionality of the network structure and the dimensionality of the pores do not have a direct relationship. In terms of the network structure and the size of the ligand, for example, a porous coordination polymer having a three-dimensional network structure and three-dimensional pores, a porous coordination polymer having two-dimensional pores, and a porous coordination polymer having one-dimensional pores are present. As described above, the dimensionality of the network structure has an effect on the flexibility and the like of the porous coordination polymer, and the dimensionality of the pores has an effect on the diffusion of the metal ion into the pores and the growth of the nanowire. As a result, there is a large effect on electrical characteristics.

With the three-dimensional pores, the diffusibility of the active metal ion is high, and the nanowire can be caused to grow to various planes. Therefore, a material having high conductivity can be obtained, and the response speed is high. In addition, using the characteristic of the nanowire growing to various planes, a CB-RAM of a cross point can be formed, that is, the problem of a wiring to a memory element can be solved. From this point of view, the three-dimensional pores are desirable.

The two-dimensional pores have a limitation on the growth direction of the nanowire as compared to the three-dimensional pores. Therefore, a smaller microswitch can be designed. The one-dimensional pores have a limitation on the growth direction of the nanowire as compared to the two-dimensional pores. Therefore, a smaller microswitch can be designed, the nanowire is linear, and thus the rigidity deteriorates. Therefore, the generation of stress on the porous coordination polymer caused by the growth and disappearance of the nanowire can be reduced, and repeating characteristics are desirable.

<Anisotropy of Pores>

Figure 3:
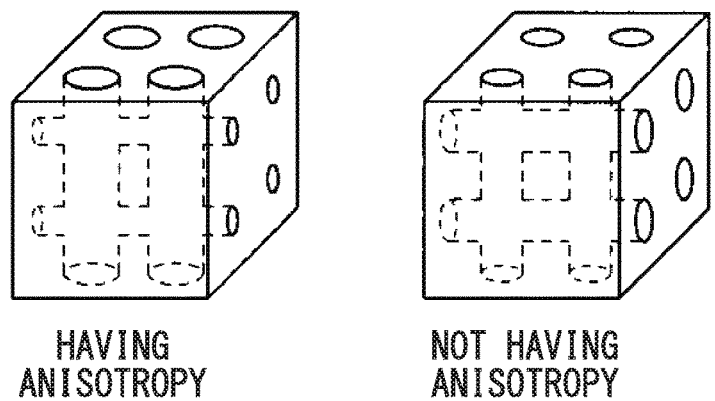
FIG. 3 is a schematic diagram illustrating anisotropy of the pores.

As illustrated in FIG. 3, assuming that a crystal lattice is a cube, in a case where pore sizes of each plane are not the same, the pores are anisotropic pores. In a case where pore sizes of each plane are the same, the pores are isotropic pores. By using the anisotropic pores, even in a case where the dimensionality of the pores is three-dimensional, the metal nanowire can be caused to grow in a predetermined orientation, and the same effects as those in a case where the porous coordination polymer having two-dimensional pores or one-dimensional pores may be obtained.

In a case where the PCP having anisotropic pores as illustrated in FIG. 3 is used, the local doping of the conductivity aid can be performed. For example, in a case where a conductivity aid (hereinafter, referred to as "conductivity aid a") is dipped in the entire region of the porous coordination polymer and then the porous coordination polymer including the conductivity aid a is dipped in a solvent or the like, the pore size in a vertical direction of the drawing is large. Therefore, the conductivity aid a leaks out only in the vertical direction. As a result, the conductivity aid can be added to the center of the crystal in the form of a layer. By dipping this material in another conductivity aid (hereinafter, referred to as "conductivity aid b"), the conductivity aid b enters from only the vertical direction in which the pore size is large. Therefore, a conductivity aid b layer can be formed above and below a conductivity aid a layer.

In addition, in a case where the doping operation of the conductivity aid a, the de-doping operation using the anisotropy, and the doping operation of the conductivity aid b are performed on the porous coordination polymer having anisotropy formed on the metal substrate, the conductivity aid is de-doped only in a direction in which the substrate is not present. Therefore, a stack of the dopants a and b is obtained. By imparting a p-type and an n-type to the dopants a and b, respectively, a pnp junction or pn junction element can be formed.

<Effect of Pore Size>

With the porous coordination polymer having a large pore size, the diffusibility of the electrode metal is high, and a thick metal nanowire is formed. Therefore, a material having a high response speed can be obtained. With the porous coordination polymer having a small pore size, the diffusibility of the electrode metal is low, and a thin metal nanowire is formed. Therefore, the response speed of the material is low. However, the cell size can be reduced, and a smaller switch can be formed. In addition, since the metal nanowire is thin, the generation of stress on the porous coordination polymer caused by the formation and disappearance of the nano wire is small, and the durability of the material is desirable.

<Orientation of Pores>

Except for the pores having no anisotropy and having a three-dimensional structure, it is necessary that the pores are present in an orientation in which the metal nanowire grows between the active metal electrode and the counter electrode. For example, even in a case where the one-dimensional pores are present parallel to the active metal electrode, conductivity cannot be obtained, and the memory effect is not also exhibited. In order to cause the pores to grow in the direction in which the metal nanowire grows between the active metal electrode and the counter electrode, an existing method of controlling a crystal orientation such as the addition of a carboxylic acid or the use of an anchor layer can be used. In addition, the orientation of the pores in the crystal can be verified by thin-film X-ray diffraction.

<Description of PCP Network Structure and Switching Characteristics>

The network structure of the PCP has an effect on conductivity and switching characteristics. The three-dimensional PCP is a PCP in which the network structure formed of the ligand and the metal ion has a three-dimensional jungle gym shape. The three-dimensional PCP has good robustness due to its structure. That is, the three-dimensional PCP is desirable from the viewpoint of the durability of the memory.

The two-dimensional PCP is a PCP in which the network structure formed of the metal ion and the ligand has a two-dimensional shape such as a net shape. The network structure itself is two-dimensional, but a crystal structure is formed by stacking a plurality of two-dimensional network structures. Only a weak intermolecular interaction works between respective two-dimensional networks. Therefore, the respective networks may slightly deviate from each other, and thus the flexibility is relatively good. Therefore, even during thinning, the two-dimensional PCP is desirable from the viewpoint of suppressing cracking caused by external stress.

The one-dimensional PCP is a PCP in which the network formed of the metal ion and the ligand has a linear structure. The network structure itself is one-dimensional, but a crystal structure is formed by stacking a plurality of one-dimensional network structures. Only a weak intermolecular interaction works between respective one-dimensional networks. Therefore, the respective networks may deviate from each other, and thus the flexibility is good. Therefore, even in a case where the formation and disappearance of the nanowire are repeated, stress is not likely to accumulate on the material, and defects such as stress cracking are not likely to occur. Therefore, the one-dimensional PCP is desirable from the viewpoint of repeating characteristics.

<Method of Forming Porous Coordination Polymer Conductor Layer>

In the present invention, a porous coordination polymer conductor layer is formed on a substrate.

<Film Thickness>

The thickness of the layer of the porous coordination polymer conductor can be determined according to the intended use. For the use as a memory, the thickness of the layer of the porous coordination polymer conductor is 0.1 to 1000 nm and, from the viewpoint of a high response speed, is preferably 0.3 to 600 nm and more preferably 1 to 500 nm.

<Forming Method>

For the formation of the porous coordination polymer conductor layer, various existing methods can be used.

(1) Dipping Method

In a dipping method, a layer (hereinafter, referred to as "anchor layer") formed of a material (hereinafter, referred to as "anchor material") for forming the porous coordination polymer is formed on a substrate (for example, a plate formed of a metal selected from the group consisting of noble metal such as Au, Pt, W, Ru, ln, or Rh, silicon, transition metal such as Cu, Ag, Zn, Co, or Mn, and Al, a plate formed of an oxide thereof, or a plate formed of a porous material such as alumina on which the metal or the metal oxide is supported), and then is dipped in a solution including the ligand material and the metal ion for forming the porous coordination polymer.

As a modification of the dipping method, the substrate on which the anchor layer is formed is alternately dipped in a ligand solution and a metal ion solution such that a porous coordination polymer layer is formed stepwise. This method is preferable from the viewpoint that the thickness can be precisely controlled.

Examples of the material that can be used as the anchor material include a material that has a functional group having affinity to the substrate at one end of the molecule and has a functional group having affinity to the porous coordination polymer at another end of the molecule.

Examples of the functional group having affinity to the substrate include thiol, carboxylic acid, phosphoric acid, sulfonic acid, an amino group, and a pyridyl group. Examples of the functional group having affinity to the porous coordination polymer include carboxylic acid, phosphoric acid, sulfonic acid, an amino group, and a pyridyl group.

Specific examples of the anchor material include normal hexane having an SH group at the 1-position and a carboxyl group at the 6-position, normal hexane having an SH group at the 1-position and a pyridyl group at the 6-position, and normal hexane having an SH group at the 1-position and a sulfonic acid group at the 6-position. The anchor material does not necessarily have a hexyl group, and linear or branched alkyl chains or aromatic compounds having various lengths can be used.

Examples of the material that can be used as the anchor layer include an organic material having a functional group at opposite terminals of the molecule. That is, a compound that has a functional group such as thiol having an interaction with a metal at one end and has a carboxyl group or a pyridyl group having an interaction with the metal ion at the other end is preferable.

Specific examples of the compound include an alcohol such as 2-mercaptoethanol, 3-mercaptopropanol, 4-mercaptobutanol, 5-mercaptopentanol, 6-mercaptohexanol, or 12-mercaptoundecanol, 2-mercaptoethanoic acid, 3-mercaptopropanoic acid, 4-mercaptobutanoic acid, 5-mercaptopentanoic acid, 6-mercaptohexanoic acid, 12-mercaptoundecanoic acid, 12-mercaptododecanoic acid, 4-(2- mercaptoethyl)benzoic acid, 4-(4-mercaptobutyl)benzoic acid, and 4-(12-mercaptoundecane)benzoic acid.

From the viewpoint of densely forming the porous coordination polymer, the alcohol having an alkyl group with 4 to 12 carbon atoms, a carboxylic acid, or a normal alkyl terminal carboxylic acid having a thiol group at a terminal and having 4 to 18 carbon atoms can be preferably used.

From the viewpoint of densely forming the porous coordination polymer, the thickness of the anchor layer is preferably 0.5 to 400 nm and more preferably 1 to 40 nm. In addition, from the viewpoint of preventing a decrease in conductivity, the thickness of the anchor layer is preferably 0.3 to 120 nm and more preferably 2 to 20 nm.

In addition, a method of forming the porous coordination polymer directly on the substrate without forming the anchor layer is also known. Even in this case, as described above, a method of dipping the substrate in a solution including both the metal ion and the ligand material and a method of alternately dipping the substrate in a solution including the metal ion and a solution including the ligand material are known.

As a modification of the method of forming the porous coordination polymer layer using the solution, for example, a method of dipping the substrate in a ligand material solution including no metal ion and causing the ligand material to react with the substrate or the metal ion eluted from the substrate into the solution so as to form the porous coordination polymer layer without adding a metal salt can be used. This method is preferable from the viewpoint that the porous coordination polymer layer can be extremely densely formed.

Examples of a method similar to the modification include a method of causing a metal oxide and the ligand material to react with each other so as to form the porous coordination polymer layer. In a case where this method is used, a material including a metal oxide layer on a surface of the substrate can be used. The thickness of the metal oxide layer can be selected according to the intended use, and is preferably 0.1 to 1000 nm and more preferably 1 to 500 nm from the viewpoint that the porous coordination polymer layer can be densely formed.

(2) Blowing Method

A method of blowing a solution that can form the porous coordination polymer layer to the substrate in a heated or unheated state instead of dipping the substrate in a solution that can form the porous coordination polymer layer can also be used. Regarding the blowing method, an existing method such as general spraying or spraying using an ink jet method can be used. Even in this method, the method of forming the anchor layer can also be used.

(3) Coating Method

As a method other than the above-described methods, for example, a method of coating the substrate with a slurry that includes the ligand material and the metal ion and can form the porous coordination polymer layer can be used. As the coating method, an existing method such as dip coating or spin coating can be used.

<Method of Preparing Porous Coordination Polymer Conductor>

The porous coordination polymer conductor according to the present invention can be prepared by adding the conductivity aid to the porous coordination polymer.

Examples of a method of adding the conductivity aid to the porous coordination polymer include the following methods.

(1) Impregnation Method

For example, an impregnation method of impregnating the porous coordination polymer with a solution in which the conductivity aid is dissolved can be used. The impregnation method is desirable from the viewpoint that various conductivity aids can be added to the porous coordination polymer. In addition, the impregnation method is desirable from the viewpoint that the addition amount of the conductivity aid can be controlled by controlling the density of the conductivity aid, the impregnation time, and the temperature.

(2) Ship-in-A-Bottle Method

In addition, as another method, for example, a method of allowing the conductivity aid to coexist during the synthesis of the porous coordination polymer such that the conductivity aid is introduced into the pores of the porous coordination polymer can also be used. A method of introducing the conductivity aid into the pores of the porous coordination polymer using the ship-in-a-bottle method is not known. However, a ship-in-a-bottle method of introducing a catalyst into the pores of the porous coordination polymer is known (Zawarotko et al., J. Am. Chem. Soc., (2011) 10356). Specifically, a method of dissolving the metal salt, the ligand material, and the conductivity aid that form the porous coordination polymer in a solution and preparing the porous coordination polymer by heating or the like can be used.

In pores of a porous coordination polymer, necking may occur. In this porous coordination polymer, the conductivity aid may not enter the pores due to necking. According to this method, the conductivity aid can be introduced into the pores of this type of the porous coordination polymer. As a result, a large amount of the conductivity aid can be introduced into the pores, and a material having a desirable memory retention time can be easily obtained. The addition amount of the conductivity aid can be controlled by controlling the amount of the conductivity aid that coexists during the synthesis.

The present invention relates to a microswitch that is formed of the conductive porous coordination polymer and the two electrode metals having different oxidation-reduction potentials. Hereinafter, the two electrode metals and a method of forming the microswitch that is formed of the two metals and the porous coordination polymer conductor will be described below.

<Electrode Metals>

In the microswitch according to the present invention, the two metals having different oxidation-reduction potentials are used for the electrodes. As the electrode metals, a combination of metals in which a difference between the oxidation-reduction potentials is 0 eV to 5.0 eV is preferable, and a combination of metals in which a difference between the oxidation-reduction potentials is 0.01 eV to 1.0 eV is more preferable.

Examples of the metal used for the first electrode include Au, Pt, W, Ru, In, Rh, and silicon. In these metals, elution or the like with respect to a solvent is not likely to occur, and the metals are electrically stable. Pt, Au, Ru, Ir, or W is preferable because it is chemically stable and is hardly soluble. Among these, Au or Pt is more preferable from the viewpoint of electrochemical stability.

In addition, for the first electrode, an oxide such as indium tin oxide (ITO: Tin-doped $In_2O_3$), titanium oxide doped with Nb or the like, zinc oxide doped with Ga, Al, or the like, or $SrTiO_3$, $SrRuO_3$, $RuO_2$, or $IrO_2$ doped with Nb or the like can be used.

As the metal that can be used for the second electrode, a conductive metal that is eluted at a low voltage and electrochemically active, for example, a metal selected from Ag, Cu, Pb, Sn, Zn, Ni, and a combination thereof can be used. From the viewpoint of high conductivity, Ag or Cu is more preferable.

In addition, a metal whose ion is not likely to migrate to the pores of the PCP layer may be used for the first electrode, and a metal whose ion is likely to migrate to the pores of the PCP layer may be used for the second electrode. In addition, in a case where the first electrode and the second electrode are used in combination, it is necessary that the easiness of the ionization of the electrode metals in the pores of the PCP layer and the easiness of the ion migration thereof satisfy "first metal<second metal".

The thickness of each of the first electrode and the second electrode may be selected according to the intended use, and is preferably 0.1 nm to 100 µm and more preferably 1 nm to 500 nm. In order to reduce the size of the memory, the thickness of each of the first electrode and the second electrode is preferably as thin as possible, for example, 500 nm or less. However, this method includes a method of eluting the metals and using the eluted ions as materials of the PCP during the formation of the PCP. Therefore, in a case where the thickness of each of the first electrode and the second electrode is extremely thin, all the metals are dissolved and the electrodes may disappear. Accordingly, in order to secure the number of atoms as a metal ion supply source and to stably obtain repeating characteristics (durability), the thickness of each of the first electrode and the second electrode is preferably 1 nm or more.

<Configuration of Circuit>

Figure 4:
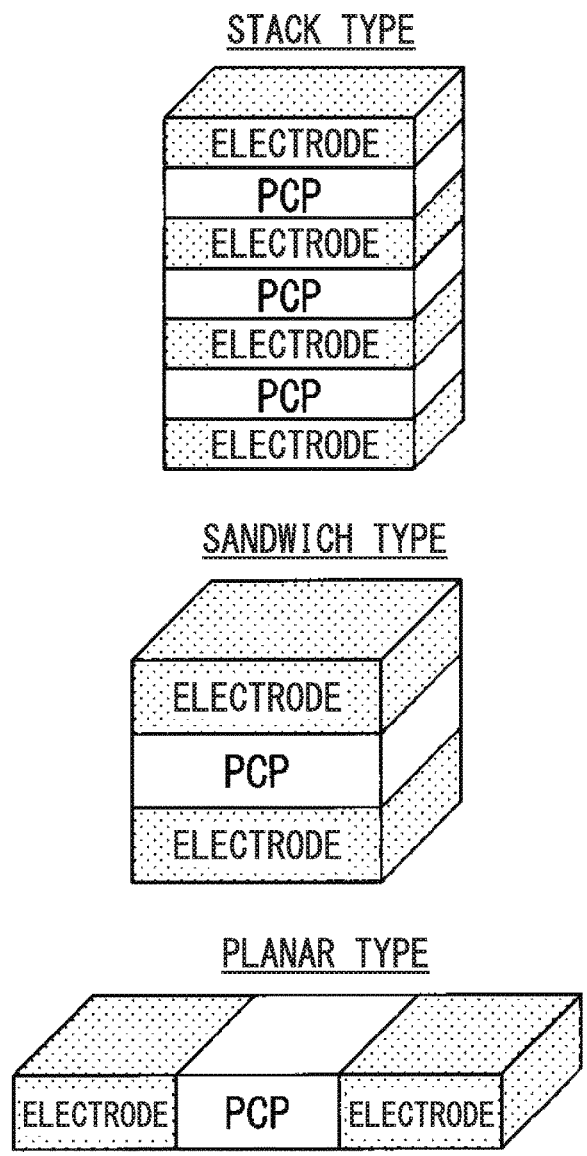
FIG. 4 is a diagram illustrating examples of an element structure and a circuit that are configured using the microswitch according to the present invention.

Examples of a circuit configuration include a stack type, a planar type, and a sandwich type as illustrated in FIG. 4. The planar type is preferable for forming a circuit used in a printable technique. The sandwich type is advantageous for high integration. The stacking type is advantageous for sophistication and high functionality.

<Method of Forming Microswitch>

Any forming method can be used as long as the microswitch illustrated in FIG. 4 can be formed. It is necessary to bring the porous coordination polymer conductor into contact with the first electrode metal and the second electrode metal, and the porous coordination polymer may be in the form of a film or particles. In addition, the microswitch according to the present invention may be formed by preparing the porous coordination polymer, bringing the porous coordination polymer into contact with one or two metals, and then adding the conductivity aid to the porous coordination polymer to convert the porous coordination polymer into the porous coordination polymer conductor.

Specifically, for example, the following methods (1) to (4) can be adopted.

(1) A method of forming the porous coordination polymer conductor layer on a metal plate formed of one of the two metals having different oxidation-reduction potentials and then forming another metal electrode on the porous coordination polymer conductor layer by sputtering, deposition, or the like.

(2) A method of forming the porous coordination polymer conductor layer on one of the two metal plates having different oxidation-reduction potentials, reacting the conductivity aid with the porous coordination polymer to make the porous coordination polymer conductive, and forming another metal electrode on the conductive porous coordination polymer by sputtering, deposition, or the like.

(3) A method of forming a gap between the two metals having different oxidation-reduction potentials, forming the porous coordination polymer in the form of a film or particles in the gap, and reacting the conductivity aid with the porous coordination polymer to make the porous coordination polymer conductive.

(4) A method of forming a gap between the two metals having different oxidation-reduction potentials, and forming the porous coordination polymer conductor in the form of a film or particles in the gap.

<Structure of Microswitch>

Figure 5A:
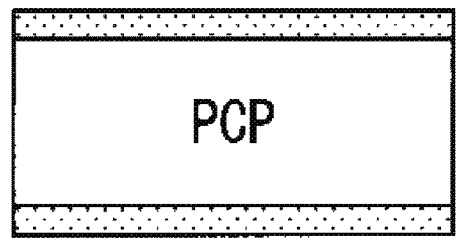
FIG. 5A is a diagram illustrating a structure example of the microswitch.
Figure 5B:
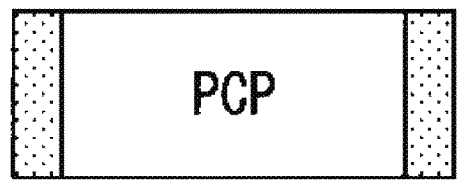
FIG. 5B is a diagram illustrating a structure example of the microswitch.
Figure 5C:
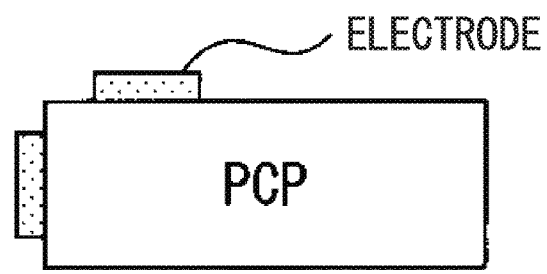
FIG. 5C is a diagram illustrating a structure example of the microswitch.
Figure 5D:
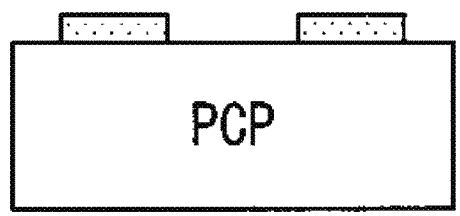
FIG. 5D is a diagram illustrating a structure example of the microswitch.

Examples of a structure of the microswitch include structures illustrated in FIGS. 5A to 5D in which a plurality of electrodes are attached to the porous coordination polymer conductor (represented by "PCP" in the drawings). Regarding the positions of the electrodes with respect to the porous coordination polymer conductor, for example, sandwich structures illustrated in FIGS. 5A and 5B, a positional relationship illustrated in FIG. 5C, or a method of disposing the electrodes on the same plane as illustrated in FIG. 5D can be adopted. One of the structures can be selected according to the desired function of the microswitch and the structure of a device into which the microswitch is incorporated. The structures illustrated in FIGS. 5A and 5B are preferable from the viewpoint that the structure can be made thin, the structure illustrated in FIG. 5A is preferable from the viewpoint that the gap between the electrode is short such that the response speed can be increased, and the structure illustrated in FIG. 5D is preferable from the viewpoint that the electrodes are on the sample plane such that manufacturing is simple.

<Method of Access to Microswitch>

A technique used in a NAND flash or the like of the related art can be used.

By locally doping the dopant, the microswitch according to the present invention is applicable to the formation of a circuit, the formation of a transistor, or the like. Hereinafter, the application to the formation of a circuit, the formation of a transistor, or the like will be described.

<Local Doping Method and Size of Dopant>

By locally doping the dopant, a pn junction or the like can be formed. A method of forming the pn junction or the like is not particularly limited. For example, a method of doping the dopant using the dipping method after masking using a photolithography technique can be adopted. By locally doping the dopant, an LSI can be formed.

In a local doping method, it is necessary to dope the desired dopant into a local region of a metal-organic framework (MOF) film using a printable technique. In a case where an ink jet method is used, doping is performed on a region of about several hundreds of nanometers to several hundreds of micrometers. The minimum level of function can be exhibited as long as one molecule of the dopant is added to one cell formed of the PCP.

<Method of Forming pn Junction>

By dividedly adding a p-type dopant and an n-type dopant to predetermined regions using a printable technique, the microswitch according to the present invention can be used as a pn junction element.

As another dividing method, for example, a method of forming a circuit after masking, dipping a p-type dopant, removing the mask, and then doping an n-type dopant or a method of performing the above-described operations reversely can be used. In addition, in the porous coordination polymer, a material having anisotropy is present. Therefore, in a case where a p-type dopant is dipped to prepare the porous coordination polymer doped with the p-type dopant and the porous coordination polymer is brought into contact with the solution, a de-doping phenomenon occurs in a specific surface. Using this characteristic, by doping the de-doped region with an n-type dopant, a pn junction can be formed.

<Method of Forming Transistor>

In a case where a pnp junction or an npn junction is formed using the same method, the pnp junction or the npn junction can be used as a transistor.

<Bulk Heterojunction Solar Cell>

Using the above-described technique, an element in which the number of pn junction surfaces is extremely increased can be prepared. This material can be used as a high-performance bulk heterojunction solar cell.

The porous coordination polymer conductor according to the present invention is material that is obtained by adding the conductivity aid to the porous coordination polymer. The conductivity aid improves conductivity by interacting with a portion having polarity such as oxygen or nitrogen included in the metal ion or the ligand of the porous coordination polymer. In addition, the conductivity aid having a relatively high aspect ratio in the pores of the porous coordination polymer rotates or changes the position in the pores during voltage application such that the effective volume in the pores changes. Due to this change in the effective pore volume and the diffusion of the metal ion of the electrode into the pores during voltage application and the reduction thereof, the metal nanowire is formed. Due to the reverse reaction of the above reaction, the metal nanowire disappears. As a result, it is considered that the switching effect is exhibited.

It is important that the porous coordination polymer conductor has robustness such that it is not effectively decomposed due to voltage application. For the rotation or the change of the position in the pores of the conductivity aid and further for the generation of the nanowire, the following points are considered to be important: that the conductivity aid has a shape having a relatively high aspect ratio; and the pores have a size to the extent that the conductivity aid is movable in the pores. However, the present invention is not limited to this theory, and the characteristics of the porous coordination polymer according to the present invention are not limited to this theory.

<Analysis of Porous Coordination Polymer>

In the analysis of the porous coordination polymer, there are various conditions, and the conditions cannot be uniquely determined. In the case of single crystals, single crystal X-ray structural analysis can be used. In a case where an existing porous coordination polymer is in the form of single crystals or a powder sample, the existing porous coordination polymer can be analyzed by powder X-ray diffraction by comparing to an existing powder X-ray diffraction pattern. In addition, the porousness of the porous coordination polymer can be substantially estimated by measuring the amount of the solvent or the like included in the pores by thermogravimetry. For the measurement of the powder X-ray diffraction, a powder X-ray diffractometer DISCOVER D8 with GADDS (manufactured by Bruker AXS Gmbh) and a powder X-ray diffractometer Smart Lab (manufactured by Rigaku Corporation) can be used. For the TG measurement, a thermogravimetric analyzer TG8120 (manufactured by Rigaku Corporation) can be used.

<Formation of PCP on Substrate>

As a method of forming the porous coordination polymer (PCP) on the substrate, any known method can be used as long as the porous coordination polymer can be densely formed. Examples of the known method include: a method of dipping the substrate in a solution in which the ligand and the metal ion are dissolved (Fiscer et al., Chem. Commun. 2009, 1031); a method of forming the porous coordination polymer step by step by alternately dipping the substrate in a ligand solution and a metal ion solution (Fiscer et al., Angew. Chem. Int. Ed. 2009, 48, 5038); a method of causing the substrate and the ligand to react with each other (Kitagawa et al., Nature Mater. (2012) 717); and a method using a CVD method (Fiscer et al., J. Am. Chem. Soc., 2008, 130, 6119). For the analysis of the film thickness, cross-sectional observation using an SEM can be used after general Pt deposition.

<Evaluation Method as Memory>

The resistance hysteresis is checked by voltage sweep-current measurement to check an operation as a memory. For the measurement, a semiconductor parameter analyzer Agilent 4155C can be used.

A circuit is formed by adopting a two-terminal contact structure on an electrode/PCP/electrode (GND) type element. For the contact, a tungsten coaxial probe HFP-120A-201 (manufactured by Micronics Japan Co., Ltd.) having a tip diameter of 3 µm can be used.

The voltage sweep using the semiconductor parameter analyzer Agilent 4155C is performed while changing the voltage using a manufacturer's program Agilent VEE at a step of 20 mV. Here, the applied voltage is set in a range of 0 to 20 V according to the element structure and the characteristics, the voltage application rate is set as 64 us/20 mV, and the current limit value Icomp is set as 1 mA in order to prevent element destruction at Set. In addition, a read voltage $V_{read}$ at a resistance value $R_{reg}$ of the memory element is 0.2 V, and the resistance value is measured during an increase and decrease in voltage of a Set operation and a Reset operation (refer to Expression A).

$$R_{reg}=V(0.2\ V)/I(0.2\ V) \quad \text{(Expression A)}$$

FIG. 1 is a graph illustrating evaluation of data retention characteristics of a memory element prepared from the microswitch according to the present invention. In the evaluation of the data retention characteristics, a voltage of 0.2 V is applied in a Reset direction at a low resistance and is applied in a Set direction at a high resistance. At this time, the resistance value is calculated according to the method (Expression A) and is evaluated. The measurement interval is 10 seconds, and the measurement time is 1 minute to 24 hours. In addition, the evaluation of repeated operation characteristics is performed by repeating the voltage application described herein.

EXAMPLES

Hereinafter, preferable examples of the present invention will be described, but the present invention is not limited to these examples. Various additions, omissions, substitutions, and other modifications can be made for the configuration within a range not departing from the scope of the present invention.

The details of a porous conductor, a first electrode, and a second electrode of a microswitch according to each of Examples (Examples according to the present invention) and Comparative Examples are shown in the following tables. In the tables, abbreviations are as follows.

TCNQ: tetracyanoquinodimethane
TCNE: tetracyanoethylene
TTF: tetrathiafulvalene
BEDT-TTF: bis(ethylenedithio)tetrathiafulvalene-tetrathiafulvalene complex
TDAE: tetrakis(dimethylamino)ethylene
BMIB: 1-butyl-3-methylimidazolium bromide TMATFB: tetramethylammonium tetrafluoroborate
TMAHFP: tetramethylammonium hexafluorophosphate
<Items of Electrochemical Evaluation>
<Definition of Memory Function>

A resistance value in a low resistance state is represented by RL, a resistance value in a high resistance state is represented by RH, and the memory function was evaluated as follows.

A resistance ratio RH/RL was evaluated based on the following criteria.

100 or higher: A
10 or higher and lower than 100: B
1.5 or higher and lower than 10: C
lower than 1.5: D <Durability of Memory>

The durability of the memory can be defined as a value of the I-V evaluation after 1 months from the preparation of the material relative to a value (initial value) of the I-V evaluation within 3 days from the preparation of the material. A case where a value of 80% or higher is retained with respect to the initial value is evaluated as A, a case where a value of 50% or higher and lower than 80% is retained with respect to the initial value is evaluated as B, a case where a value of 30% or higher and lower than 50% is retained with respect to the initial value is evaluated as C, and a case where a value of lower than 30% is retained with respect to the initial value is evaluated as D.

<Response Speed of Memory (Response Speed of Switching Element)>

The response speed of the memory is estimated by applying a voltage pulse (or a current pulse) having a given width to the memory element and gradually increasing the pulse height until switching (Reset or Set) occurs. Determination criteria on the occurrence of Reset or Set are as described above regarding (1) the definition of the memory function.

By obtaining the pulse height at which switching occurred with respect to a plurality of pulse widths, the pulse width, that is, a relationship between the response speed of the memory and the pulse height can be obtained. By interpolating or extrapolating this relationship, the memory response speed can be estimated with respect to a predetermined pulse height. Likewise, a relationship between the pulse height and the memory response speed can be estimated by applying a voltage pulse (or a current pulse) having a given height to the memory element and gradually increasing the pulse width until switching (Reset or Set) occurs. Based on the response speed during the application of a pulse voltage having a height of 3 V, the performance is determined based on the following criteria.

10 ns or longer and shorter than 1 µs: A
1 µs or longer and shorter than 10 µs: B
10 µs or longer and shorter than 100 µs: C
100 µs or longer: D <Retention Time of Memory>

The data retention time of the memory can be estimated by monitoring the resistance transition of the memory element in a state where a constant voltage or a constant current is maintained and evaluating the time measured until the monitored resistance of the memory deviates from the resistance value range defined as the low resistance or the high resistance. In many cases, an acceleration test is performed by increasing the temperature or the humidity.

As evaluation criteria, a case where the time until the monitored resistance deviates from the defined resistance value range is 24 hours or longer is evaluated as A, a case where the time until the monitored resistance deviates from the defined resistance value range is 5000 seconds or longer and shorter than 24 hours is evaluated as B, a case where the time until the monitored resistance deviates from the defined resistance value range is 100 seconds or longer and shorter than 5000 seconds is evaluated as C, and a case where the time until the monitored resistance deviates from the defined resistance value range is shorter than 100 seconds is evaluated as D.

<Number of Times of Rewrite of Memory (Number of Times of Repetition)>

The number of times of rewrite of the memory (number of times of repetition) can be estimated and evaluated by applying a voltage sweep (or a current sweep) or a pulse voltage (or a pulse current) and repeating the low resistance operation (Set) and the high resistance operation (Reset). In a case where Set or Reset occurs, when the resistance value after the application of a voltage sweep (or a current sweep) or a pulse voltage (or a pulse current) is not switched into the resistance range identified as low resistance or high resistance, it can be considered that error occurs. The number of times of switching until that time is defined as the number of times of repetition. By repeatedly sweeping the voltage to ±3 V at a constant speed of ±1 V/s, Reset is repeatedly caused to occur. Switching is repeated under the following conditions until the memory element is inoperable, and the characteristics are ranked and evaluated as follows.

A: $10^6$ times or more
B: less than $10^6$ times and $10^5$ times or more
C: less than $10^5$ times and $10^4$ times or more
D: less than $10^4$ times Example 1 (Example According to Present Invention)

A porous coordination polymer so-called HKUST-1 including a copper ion and having a three-dimensional isotropic network structure was synthesized under conditions of documents such as Fiscer et al., Chem. Commun. 2009, 1031 in the presence of electrode metal. As a result, a thin layer of HKUST-1 (thickness: 0.1 to 1 micron) was formed on the electrode. Here, the three-dimensional isotropic network structure refers to a structure in which a crystal structure clarified by X-ray structural analysis is isotropic when seen from any one of an X-axis, a Y-axis, and a Z-axis. The electrode having a surface on which the porous coordination polymer was stacked was dipped in a dichloromethane saturated solution of tetracyanoquinodimethane as a conductivity aid at room temperature for 24 hours. The electrode having a surface on which the porous coordination polymer conductor formed by the addition of the conductivity aid was formed on a memory circuit using the above-described method, and the resistance hysteresis was checked by the above-described voltage sweep-current measurement to verify a memory effect.

In this example, there was no problem in the response speed of the switching element, but the durability was low. The reason for this is presumed as follows. Tetracyanoquinodimethane of the dopant was smaller than the pore size of HKUST-1, and an interaction between a copper ion included in HKUST-1 and tetracyanoquinodimethane was weak. Therefore, tetracyanoquinodimethane of the dopant migrated in the pores of HKUST-1, and the memory effect was lost.

Examples 2 to 10 (Examples According to Present Invention)

Materials including various conductivity aids were prepared under the same conditions as in Example 1 and were evaluated using the same method as in Example 1. As a result, the memory effects were verified.

Examples 11 to 20 (Examples According to Present Invention)

A porous coordination polymer including a nickel ion and having a three-dimensional isotropic network structure was synthesized using a method described in Caskey et al., J. J. Am. Chem. Soc. 2008, 130, 10870, "CPO-27-Ni", conductive materials were prepared under the same conditions as in Examples 1 to 10, and the memory effects thereof were evaluated. As a result, desirable memory effects were verified.

Examples 21 to 32 (Examples According to Present Invention)

A porous coordination polymer (described as "Compound 1" in the document) including a zinc ion and having a three-dimensional anisotropic network structure was synthesized using a method described in Kim et al., Angew. Chem. Int. Ed. (2004) 5033, conductive materials including the porous coordination polymer were prepared under the same conditions as in Examples 1 to 10, and the memory effects thereof were evaluated. As a result, desirable memory effects were verified. Here, the three-dimensional anisotropic network structure refers to a structure in which a crystal structure clarified by X-ray structural analysis when seen from any one of an X-axis, a Y-axis, and a Z-axis is different from that when seen from another axis.

Examples 33 to 41 (Examples According to Present Invention)

A porous coordination polymer (described as "Compound 1" in the document) including a copper ion and having a two-dimensional network structure was synthesized using a method described in Burrows et al., Dalton Trans. (2008) 6788, conductive materials including the porous coordination polymer were prepared under the same conditions as in Examples 1 to 10, and the memory effects thereof were evaluated. As a result, desirable memory effects were verified.

Examples 42 to 50 (Examples According to Present Invention)

A porous coordination polymer (described as "Compound 1" in the document) including a rhodium ion and having a one-dimensional network structure was synthesized using a method described in Mori et al., Chem. Lett., (2002) 12, conductive materials including the porous coordination polymer were prepared under the same conditions as in Examples 1 to 10, and the memory effects thereof were evaluated. As a result, desirable memory effects were verified.

TABLE 1

| Example | PCP Kind | Pore Type | Metal Ion | Ligand | Name or Compositional Formula of PCP | Conductivity Aid | Addition Method | Active Metal (Second Electrode) | Inactive Metal First Electrode |
|---|---|---|---|---|---|---|---|---|---|
| 1 | Three-Dimensional | 3D Isotropic | Cu | btc | HKUST-1 | TCNQ | Dipping Method | Cu | Pt |
| 2 | Three-Dimensional | 3D Isotropic | Cu | btc | HKUST-1 | TCNE | Dipping Method | Cu | Pt |
| 3 | Three-Dimensional | 3D Isotropic | Cu | btc | HKUST-1 | TTF | Dipping Method | Cu | Pt |
| 4 | Three-Dimensional | 3D Isotropic | Cu | btc | HKUST-1 | BEDT – TTF | Dipping Method | Cu | Pt |
| 5 | Three-Dimensional | 3D Isotropic | Cu | btc | HKUST-1 | TDAE | Dipping Method | Ag | Pt |
| 6 | Three-Dimensional | 3D Isotropic | Cu | btc | HKUST-1 | TCNE + TTF | Dipping Method | Cu | Pt |
| 7 | Three-Dimensional | 3D Isotropic | Cu | btc | HKUST-1 | TCNQ + TCNE | Dipping Method | Cu | Au |
| 8 | Three-Dimensional | 3D Isotropic | Cu | btc | HKUST-1 | TCNE + TMATFB | Dipping Method | Cu | Pt |
| 9 | Three-Dimensional | 3D Isotropic | Cu | btc | HKUST-1 | TTF + TMATFB | Dipping Method | Cu | Pt |
| 10 | Three-Dimensional | 3D Isotropic | Cu | btc | HKUST-1 | BEDT – TTF + TMAHFP | Dipping Method | Cu | Pt |
| 11 | Three-Dimensional | 3D Isotropic | Ni | tpa $(OH)_2$ | MOF-74 (Ni) | TCNQ | Dipping Method | Cu | Pt |
| 12 | Three-Dimensional | 3D Isotropic | Ni | tpa $(OH)_2$ | MOF-74 (Ni) | TCNE | Dipping Method | Cu | Pt |
| 13 | Three-Dimensional | 3D Isotropic | Ni | tpa $(OH)_2$ | MOF-74 (Ni) | TTF | Dipping Method | Cu | Pt |
| 14 | Three-Dimensional | 3D Isotropic | Ni | tpa $(OH)_2$ | MOF-74 (Ni) | BEDT – TTF | Dipping Method | Cu | Pt |
| 15 | Three-Dimensional | 3D Isotropic | Ni | tpa $(OH)_2$ | MOF-74 (Ni) | TDAE | Dipping Method | Ag | Pt |
| 16 | Three-Dimensional | 3D Isotropic | Ni | tpa $(OH)_2$ | MOF-74 (Ni) | TCNE + TTF | Dipping Method | Cu | Pt |
| 17 | Three-Dimensional | 3D Isotropic | Ni | tpa $(OH)_2$ | MOF-74 (Ni) | TCNQ + TCNE | Dipping Method | Cu | Au |
| 18 | Three-Dimensional | 3D Isotropic | Ni | tpa $(OH)_2$ | MOF-74 (Ni) | TCNE + TMATFB | Dipping Method | Cu | Pt |
| 19 | Three-Dimensional | 3D Isotropic | Ni | tpa $(OH)_2$ | MOF-74 (Ni) | TTF + TMATFB | Dipping Method | Cu | Pt |
| 20 | Three-Dimensional | 3D Isotropic | Ni | tpa $(OH)_2$ | MOF-74 (Ni) | BEDT – TTF + TMAHFP | Dipping Method | Cu | Pt |
| 21 | Three-Dimensional | 3D Isotropic | Zn | tpa, dabco | [$Zn_2$ (1, 4-bdc)$_2$ (dabco)] | BEDT – TTF | Dipping Method | Cu | Pt |
| 22 | Three-Dimensional | 3D Isotropic | Zn | tpa, dabco | [$Zn_2$ (1, 4-bdc)$_2$ (dabco)] | TCNE | Dipping Method | Cu | Pt |
| 23 | Three-Dimensional | 3D Isotropic | Zn | tpa, dabco | [$Zn_2$ (1, 4-bdc)$_2$ (dabco)] | TTF | Dipping Method | Cu | Pt |
| 24 | Three-Dimensional | 3D Isotropic | Zn | tpa, dabco | [$Zn_2$ (1, 4-bdc)$_2$ (dabco)] | BEDT – TTF | Dipping Method | Cu | Pt |
| 25 | Three-Dimensional | 3D Isotropic | Zn | tpa, dabco | [$Zn_2$ (1, 4-bdc)$_2$ (dabco)] | TDAE | Dipping Method | Ag | Pt |
| 26 | Three-Dimensional | 3D Isotropic | Zn | tpa, dabco | [$Zn_2$ (1, 4-bdc)$_2$ (dabco)] | TCNE + TTF | Dipping Method | Cu | Pt |
| 27 | Three-Dimensional | 3D Isotropic | Zn | tpa, dabco | [$Zn_2$ (1, 4-bdc)$_2$ (dabco)] | TCNQ + TCNE | Dipping Method | Cu | Au |
| 28 | Three-Dimensional | 3D Isotropic | Zn | tpa, dabco | [$Zn_2$ (1, 4-bdc)$_2$ (dabco)] | TCNE + TTF | Dipping Method | Cu | Pt |
| 29 | Three-Dimensional | 3D Isotropic | Zn | tpa, dabco | [$Zn_2$ (1, 4-bdc)$_2$ (dabco)] | TCNQ + TCNE | Dipping Method | Cu | Pt |
| 30 | Three-Dimensional | 3D Isotropic | Zn | tpa, dabco | [$Zn_2$ (1, 4-bdc)$_2$ (dabco)] | TCNE + TMATFB | Dipping Method | Cu | Pt |
| 31 | Three-Dimensional | 3D Isotropic | Zn | tpa, dabco | [$Zn_2$ (1, 4-bdc)$_2$ (dabco)] | TTF + TMATFB | Dipping Method | Ag | Pt |
| 32 | Three-Dimensional | 3D Isotropic | Zn | tpa, dabco | [$Zn_2$ (1, 4-bdc)$_2$ (dabco)] | BEDT – TTF + TMAHFP | Dipping Method | Cu | Pt |
| 33 | Two-Dimensional | 1D | Cu | ipa | KGM-$NO_2$ | TCNE | Dipping Method | Cu | Pt |
| 34 | Two-Dimensional | 1D | Cu | ipa | KGM-$NO_2$ | TTF | Dipping Method | Cu | Pt |
| 35 | Two-Dimensional | 1D | Cu | ipa | KGM-$NO_2$ | BEDT – TTF | Dipping Method | Cu | Pt |

TABLE 1-continued

| Example | PCP Kind | Pore Type | Metal Ion | Ligand | Name or Compositional Formula of PCP | Conductivity Aid | Addition Method | Active Metal (Second Electrode) | Inactive Metal First Electrode |
|---|---|---|---|---|---|---|---|---|---|
| 36 | Two-Dimensional | 1D | Cu | ipa | KGM-NO$_2$ | TDAE | Dipping Method | Ag | Pt |
| 37 | Two-Dimensional | 1D | Cu | ipa | KGM-NO$_2$ | TCNE + TTF | Dipping Method | Cu | Pt |
| 38 | Two-Dimensional | 1D | Cu | ipa | KGM-NO$_2$ | TCNQ + TCNE | Dipping Method | Cu | Au |
| 39 | Two-Dimensional | 1D | Cu | ipa | KGM-NO$_2$ | TCNE + TMATFB | Dipping Method | Cu | Pt |
| 40 | Two-Dimensional | 1D | Cu | ipa | KGM-NO$_2$ | TTF + BMIB | Dipping Method | Cu | Pt |
| 41 | Two-Dimensional | 1D | Cu | ipa | KGM-NO$_2$ | BEDT – TTF + TMAHFP | Dipping Method | Cu | Pt |
| 42 | One-Dimensional | 1D | Cu | ipa | KGM-NO$_2$ | TCNE | Dipping Method | Cu | Pt |
| 43 | One-Dimensional | 1D | Cu | ipa | KGM-NO$_2$ | TTF | Dipping Method | Cu | Pt |
| 44 | One-Dimensional | 1D | Cu | ipa | KGM-NO$_2$ | BEDT – TTF | Dipping Method | Cu | Pt |
| 45 | One-Dimensional | 1D | Cu | ipa | KGM-NO$_2$ | TDAE | Dipping Method | Ag | Pt |
| 46 | One-Dimensional | 1D | Cu | ipa | KGM-NO$_2$ | TCNE + TTF | Dipping Method | Cu | Pt |
| 47 | One-Dimensional | 1D | Cu | ipa | KGM-NO$_2$ | TCNQ + TCNE | Dipping Method | Cu | Au |
| 48 | One-Dimensional | 1D | Cu | ipa | KGM-NO$_2$ | TCNE + BMIB | Dipping Method | Cu | Pt |
| 49 | One-Dimensional | 1D | Cu | ipa | KGM-NO$_2$ | TTF + TMATFB | Dipping Method | Cu | Pt |
| 50 | One-Dimensional | 1D | Cu | ipa | KGM-NO$_2$ | BEDT – TTF + TMAHFP | Dipping Method | Cu | Pt |

Examples 51 to 100 (Examples According to Present Invention)

Porous coordination polymers including various dopants were synthesized using the same method as in Examples 1 to 50, and memory effect thereof were verified. However, after synthesizing each of the porous coordination polymers using the method as in Examples 1 to 50, instead of adding the conductivity aid, a desired conductivity aid was allowed to coexist in a solution for the synthesis of the porous coordination polymer as described in Zawarotko et al., J. Am. Chem. Soc., (2011) 10356. As a result, the conductivity aid was incorporated into the pores of the porous coordination polymer. Using this ship-in-a-bottle method, conductivity aid-porous coordination polymer complexes were synthesized.

TABLE 2

| Example | PCP Kind | Pore Type | Metal Ion | Ligand | Name or Compositional Formula of PCP | Conductivity Aid | Addition Method | Active Metal (Second Electrode) | Inactive Metal First Electrode |
|---|---|---|---|---|---|---|---|---|---|
| 51 | Three-Dimensional | 3D Isotropic | Cu | btc | HKUST-1 | TCNQ | SIB Method | Cu | Pt |
| 52 | Three-Dimensional | 3D Isotropic | Cu | btc | HKUST-1 | TCNE | SIB Method | Cu | Pt |
| 53 | Three-Dimensional | 3D Isotropic | Cu | btc | HKUST-1 | TTF | SIB Method | Cu | Pt |
| 54 | Three-Dimensional | 3D Isotropic | Cu | btc | HKUST-1 | BEDT – TTF | SIB Method | Cu | Pt |
| 55 | Three-Dimensional | 3D Isotropic | Cu | btc | HKUST-1 | TDAE | SIB Method | Ag | Pt |
| 56 | Three-Dimensional | 3D Isotropic | Cu | btc | HKUST-1 | TCNE + TTF | SIB Method | Cu | Pt |
| 57 | Three-Dimensional | 3D Isotropic | Cu | btc | HKUST-1 | TCNQ + TCNE | SIB Method | Cu | Au |
| 58 | Three-Dimensional | 3D Isotropic | Cu | btc | HKUST-1 | TCNE + TMATFB | SIB Method | Cu | Pt |
| 59 | Three-Dimensional | 3D Isotropic | Cu | btc | HKUST-1 | TTF + TMATFB | SIB Method | Cu | Pt |
| 60 | Three-Dimensional | 3D Isotropic | Cu | btc | HKUST-1 | BEDT – TTF + TMAHFP | SIB Method | Cu | Pt |
| 61 | Three-Dimensional | 3D Isotropic | Ni | tpa (OH)$_2$ | MOF-74 (Ni) | TCNQ | SIB Method | Cu | Pt |
| 62 | Three-Dimensional | 3D Isotropic | Ni | tpa (OH)$_2$ | MOF-74 (Ni) | TCNE | SIB Method | Cu | Pt |
| 63 | Three-Dimensional | 3D Isotropic | Ni | tpa (OH)$_2$ | MOF-74 (Ni) | TTF | SIB Method | Cu | Pt |
| 64 | Three-Dimensional | 3D Isotropic | Ni | tpa (OH)$_2$ | MOF-74 (Ni) | BEDT – TTF | SIB Method | Cu | Pt |
| 65 | Three-Dimensional | 3D Isotropic | Ni | tpa (OH)$_2$ | MOF-74 (Ni) | TDAE | SIB Method | Ag | Pt |
| 66 | Three-Dimensional | 3D Isotropic | Ni | tpa (OH)$_2$ | MOF-74 (Ni) | TCNE + TTF | SIB Method | Cu | Au |
| 67 | Three-Dimensional | 3D Isotropic | Ni | tpa (OH)$_2$ | MOF-74 (Ni) | TCNQ + TCNE | SIB Method | Cu | Pt |
| 68 | Three-Dimensional | 3D Isotropic | Ni | tpa (OH)$_2$ | MOF-74 (Ni) | TCNE + TMATFB | SIB Method | Cu | Pt |
| 69 | Three-Dimensional | 3D Isotropic | Ni | tpa (OH)$_2$ | MOF-74 (Ni) | TTF + TMATFB | SIB Method | Cu | Pt |
| 70 | Three-Dimensional | 3D Isotropic | Ni | tpa (OH)$_2$ | MOF-74 (Ni) | BEDT – TTF + TMAHFP | SIB Method | Cu | Pt |
| 71 | Three-Dimensional | 3D Anisotropic | Zn | tpa, dabco | [Zn$_2$ (1, 4-bdc)$_2$ (dabco)] | BEDT – TTF | SIB Method | Cu | Pt |
| 72 | Three-Dimensional | 3D Anisotropic | Zn | tpa, dabco | [Zn$_2$ (1, 4-bdc)$_2$ (dabco)] | TCNE | SIB Method | Cu | Pt |
| 73 | Three-Dimensional | 3D Anisotropic | Zn | tpa, dabco | [Zn$_2$ (1, 4-bdc)$_2$ (dabco)] | TTF | SIB Method | Cu | Pt |
| 74 | Three-Dimensional | 3D Anisotropic | Zn | tpa, dabco | [Zn$_2$ (1, 4-bdc)$_2$ (dabco)] | BEDT – TTF | SIB Method | Cu | Pt |
| 75 | Three-Dimensional | 3D Anisotropic | Zn | tpa, dabco | [Zn$_2$ (1, 4-bdc)$_2$ (dabco)] | TDAE | SIB Method | Ag | Pt |
| 76 | Three-Dimensional | 3D Anisotropic | Zn | tpa, dabco | [Zn$_2$ (1, 4-bdc)$_2$ (dabco)] | TCNE + TTF | SIB Method | Cu | Pt |
| 77 | Three-Dimensional | 3D Anisotropic | Zn | tpa, dabco | [Zn$_2$ (1, 4-bdc)$_2$ (dabco)] | TCNQ + TCNE | SIB Method | Cu | Au |
| 78 | Three-Dimensional | 3D Anisotropic | Zn | tpa, dabco | [Zn$_2$ (1, 4-bdc)$_2$ (dabco)] | TCNE + TTF | SIB Method | Cu | Pt |
| 79 | Three-Dimensional | 3D Anisotropic | Zn | tpa, dabco | [Zn$_2$ (1, 4-bdc)$_2$ (dabco)] | TCNQ + TCNE | SIB Method | Cu | Pt |
| 80 | Three-Dimensional | 3D Anisotropic | Zn | tpa, dabco | [Zn$_2$ (1, 4-bdc)$_2$ (dabco)] | TCNE + TMATFB | SIB Method | Cu | Pt |
| 81 | Three-Dimensional | 3D Anisotropic | Zn | tpa, dabco | [Zn$_2$ (1, 4-bdc)$_2$ (dabco)] | TTF + TMATFB | SIB Method | Ag | Pt |
| 72 | Three-Dimensional | 3D Anisotropic | Zn | tpa, dabco | [Zn$_2$ (1, 4-bdc)$_2$ (dabco)] | BEDT – TTF + TMAHFP | SIB Method | Cu | Pt |
| 73 | Two-Dimensional | 1D | Cu | ipa | KGM-NO$_2$ | TCNE | SIB Method | Cu | Pt |

TABLE 2-continued

| Example | PCP Kind | Pore Type | Metal Ion | Ligand | Name or Compositional Formula of PCP | Conductivity Aid | Addition Method | Active Metal (Second Electrode) | Inactive Metal First Electrode) |
|---|---|---|---|---|---|---|---|---|---|
| 74 | Two-Dimensional | 1D | Cu | ipa | KGM-NO$_2$ | TTF | SIB Method | Cu | Pt |
| 85 | Two-Dimensional | 1D | Cu | ipa | KGM-NO$_2$ | BEDT – TTF | SIB Method | Cu | Pt |
| 86 | Two-Dimensional | 1D | Cu | ipa | KGM-NO$_2$ | TDAE | SIB Method | Ag | Pt |
| 87 | Two-Dimensional | 1D | Cu | ipa | KGM-NO$_2$ | TCNE + TTF | SIB Method | Cu | Pt |
| 88 | Two-Dimensional | 1D | Cu | ipa | KGM-NO$_2$ | TCNQ + TCNE | SIB Method | Cu | Au |
| 89 | Two-Dimensional | 1D | Cu | ipa | KGM-NO$_2$ | TCNE + TMATFB | SIB Method | Cu | Pt |
| 90 | Two-Dimensional | 1D | Cu | ipa | KGM-NO$_2$ | TTF + TMATFB | SIB Method | Cu | Pt |
| 91 | Two-Dimensional | 1D | Cu | ipa | KGM-NO$_2$ | BEDT – TTF + TMAHFP | SIB Method | Cu | Pt |
| 92 | One-Dimensional | 1D | Cu | ipa | KGM-NO$_2$ | TCNE | SIB Method | Cu | Pt |
| 93 | One-Dimensional | 1D | Cu | ipa | KGM-NO$_2$ | TTF | SIB Method | Cu | Pt |
| 94 | One-Dimensional | 1D | Cu | ipa | KGM-NO$_2$ | BEDT – TTF | SIB Method | Cu | Pt |
| 95 | One-Dimensional | 1D | Cu | ipa | KGM-NO$_2$ | BMIB | SIB Method | Ag | Pt |
| 96 | One-Dimensional | 1D | Cu | ipa | KGM-NO$_2$ | TCNE + TTF | SIB Method | Cu | Pt |
| 97 | One-Dimensional | 1D | Cu | ipa | KGM-NO$_2$ | TCNQ + TCNE | SIB Method | Cu | Au |
| 98 | One-Dimensional | 1D | Cu | ipa | KGM-NO$_2$ | TTF + TMATFB | SIB Method | Cu | Pt |
| 99 | One-Dimensional | 1D | Cu | ipa | KGM-NO$_2$ | TCNE + BMIB | SIB Method | Cu | Pt |
| 100 | One-Dimensional | 1D | Cu | ipa | KGM-NO$_2$ | BEDT – TTF + TMAHFP | SIB Method | Cu | Pt |

The evaluation results of Examples (Examples according to the present invention) are shown in the following tables.

TABLE 3

| Example | Memory Function | Durability | Response Speed of Switching Element |
|---|---|---|---|
| 1 | B | D | B |
| 2 | B | B | B |
| 3 | B | A | B |
| 4 | B | A | B |
| 5 | B | B | B |
| 6 | B | A | B |
| 7 | B | B | B |
| 8 | B | A | B |
| 9 | B | A | B |
| 10 | B | A | B |
| 11 | B | C | A |
| 12 | B | B | A |
| 13 | B | A | A |
| 14 | B | A | B |
| 15 | B | B | B |
| 16 | B | A | B |
| 17 | B | B | A |
| 18 | B | A | A |
| 19 | B | A | B |
| 20 | B | A | B |
| 21 | B | A | B |
| 22 | B | B | A |
| 23 | B | A | B |
| 24 | B | A | B |
| 25 | B | B | B |
| 26 | B | A | B |
| 27 | B | B | A |
| 28 | B | A | A |
| 29 | B | B | A |
| 30 | B | A | B |
| 31 | B | A | B |
| 32 | B | A | B |
| 33 | B | B | A |
| 34 | B | A | B |
| 35 | B | B | B |
| 36 | B | B | B |
| 37 | B | A | A |
| 38 | B | B | A |
| 39 | B | A | A |
| 40 | B | A | B |
| 41 | B | A | B |
| 42 | B | B | A |
| 43 | B | A | B |
| 44 | B | A | B |
| 45 | B | B | B |
| 46 | B | A | A |
| 47 | B | B | A |
| 48 | B | A | A |
| 49 | B | A | B |
| 50 | B | A | B |

TABLE 4

| Example | Memory Function | Durability | Response Speed of Switching Element |
|---|---|---|---|
| 51 | B | C | C |
| 52 | B | B | A |
| 53 | B | A | B |
| 54 | B | A | B |
| 55 | B | A | B |
| 56 | B | A | B |
| 57 | B | B | A |
| 58 | B | A | B |
| 59 | B | A | B |
| 60 | B | A | B |
| 61 | B | C | A |
| 62 | B | B | A |
| 63 | B | A | A |
| 64 | B | A | A |
| 65 | B | B | A |
| 66 | B | A | A |
| 67 | B | B | A |
| 68 | B | A | A |
| 69 | B | A | A |
| 70 | B | A | A |
| 71 | B | B | A |
| 72 | B | B | A |
| 73 | B | A | A |
| 74 | B | A | A |
| 75 | B | B | A |
| 76 | B | A | A |
| 77 | B | B | A |
| 78 | B | A | A |
| 79 | B | B | A |

TABLE 4-continued

| Example | Memory Function | Durability | Response Speed of Switching Element |
|---|---|---|---|
| 80 | B | A | A |
| 81 | B | A | A |
| 72 | B | A | A |
| 73 | B | B | A |
| 74 | B | A | A |
| 85 | B | A | A |
| 86 | B | B | A |
| 87 | B | A | A |
| 88 | B | B | A |
| 89 | B | A | A |
| 90 | B | A | A |
| 91 | B | A | A |
| 92 | B | B | A |
| 93 | B | A | B |
| 94 | B | A | B |
| 95 | B | A | B |
| 96 | B | A | A |
| 97 | B | A | A |
| 98 | B | A | A |
| 99 | B | A | B |
| 100 | B | A | B |

Comparative Examples 1 to 5

Porous coordination polymers according to Comparative Examples 1 to 5 were synthesized using the same method as in Examples 1, 11, 21, 33, and 42, except that the conductivity aid was not added. The evaluation results of the porous coordination polymers are shown in Table 5. In all the Comparative Examples, the memory functions were evaluated as D. In addition, since the memory functions were not sufficient, the durability and the response speed of the switching element were not able to be evaluated.

TABLE 5

| Comparative Example | PCP Kind | Pore Type | Metal Ion | Ligand | Name or Compositional Formula of PCP | Conductivity Aid | Addition Method | Active Metal (Second Electrode) | Inactive Metal (First Electrode) | Memory Function | Durability | Response Speed of Switching Element |
|---|---|---|---|---|---|---|---|---|---|---|---|---|
| 1 | Three-Dimensional | 3D Isotropic | Cu | btc | HKUST-1 | None | Dipping Method | Cu | Pt | D | – | – |
| 2 | Three-Dimensional | 3D Isotropic | Ni | tpa (OH)$_2$ | MOF-74 (Ni) | None | Dipping Method | Cu | Pt | D | – | – |
| 3 | Three-Dimensional | 3D Anisotropic | Zn | tpa, dabco | [Zn$_2$ (1, 4-bdc)$_2$ (dabco)] | None | Dipping Method | Cu | Pt | D | – | – |
| 4 | Two-Dimensional | 1D | Cu | ipa | KGM-NO$_2$ | None | Dipping Method | Cu | Pt | D | – | – |
| 5 | One-Dimensional | 1D | Cu | ipa | KGM-NO$_2$ | None | Dipping Method | Cu | Pt | D | – | – |

The details of the porous conductor, the first electrode, and the second electrode of the microswitch according to each of Examples (Examples according to the present invention) and Comparative Examples are shown in Tables 6 and 7.

TABLE 6

| Example | PCP Network | Pore Type | Metal Ion | Ligand | Name or Compositional Formula of PCP | Description of PCP Synthesis | Conductivity Aid 1 | Conductivity Aid 2 | Addition Method | Active Metal (Second Electrode) | Inactive Metal (First Electrode) |
|---|---|---|---|---|---|---|---|---|---|---|---|
| 101 | Three-Dimensional | 3D Isotropic | Cu | btc | HKUST-1 | Compound described as HKUST-1 in Williams et al., Science (1999) 283, 1148 | TCNQ | None | Dipping Method | Cu | Pt |
| 102 | Three-Dimensional | 3D Isotropic | Zn | tpa | MOF5 | Compound described as MOF-5 in Yaghi et al., Tetrahedron (2008) 8553 | TCNQ | None | Dipping Method | Cu | Pt |
| 103 | Three-Dimensional | 3D Isotropic | Zn | 2.5-dihyroxy tpa | MOF74 | Compound described as MOF-74 in Yaghi et al., Tetrahedron (2008) 8553 | TCNQ | None | Dipping Method | Cu | Pt |
| 104 | Three-Dimensional | 3D Isotropic | Ni | Mixed Ligand of Naphthalenedicarboxylic Acid and Pyridylbenzoic Acid | MCF-19 | Compound described as MCF-19 in Chen et al., Angew. Chem. Int. Ed. (2009) 5287 | TCNQ | None | Dipping Method | Ag | Pt |

TABLE 6-continued

| Example | PCP Network | Pore Type | Metal Ion | Ligand | Name or Compositional Formula of PCP | Description of PCP Synthesis | Conductivity Aid 1 | Conductivity Aid 2 | Addition Method | Active Metal (Second Electrode) | Inactive Metal (First Electrode) |
|---|---|---|---|---|---|---|---|---|---|---|---|
| 105 | Three-Dimensional | 3D Isotropic | Zn | btb | UMCM-1 | Compound described as UMCM-1 in Matzger et al, Angew. Chem. Int. Ed. (2008) 677 | TCNQ | None | Dipping Method | Cu | Pt |
| 106 | Three-Dimensional | 3D Isotropic | Zr | tpa | Uio-66 | Compound described as Uio-66 in Bordiga et al., J. Am. Chem. Soc. (2008)13850 | TCNQ | None | Dipping Method | Cu | Pt |
| 107 | Three-Dimensional | 3D Isotropic | Zn | Imidazole | ZIF-8 | Compound described as Z1F-8 in Wiebcke et al., Chem. Mater. (2009) 1411 | TCNQ | None | Dipping Method | Cu | Pt |
| 108 | Three-Dimensional | 3D Isotropic | Cu | bpy | — | Compound 1a described in Carlucci et al., Chem. Commun. (2002) 1354 | TCNQ | None | Dipping Method | Cu | Pt |
| 109 | Three-Dimensional | 1D | Ba | btb | [Ba(HBTB)] | Compound described as [Ba(HBTB)] in Kitagawa et al., Inorg. Chem (2011) 11853 | TCNQ | None | Dipping Method | Cu | Pt |
| 110 | Three-Dimensional | 1D | Ag | Hatz | — | Compound 1 described in Chen et al., J. Am. Chem. Soc. (2005) 14162 | TCNQ | None | Dipping Method | Cu | Pt |
| 111 | Three-Dimensional | 1D | Cu | bpe | — | Compound 3 described in Kitagawa et al., Chem. Mater. (2009) 3346 | TCNQ | None | Dipping Method | Cu | Pt |
| 112 | Three-Dimensional | 3D Anisotropic | Zn | tpa, dabco | [$Zn_2$(1,4-bdc)$_2$(dabco)] | Compound 1 desccribed in Kim et al., Angew. Chem. Int. Ed. (2004) 5033 | TCNQ | None | Dipping Method | Cu | Pt |
| 113 | Two-Dimensional | 1D | Cu | bpy | ELM-11 | Compound 2 described in Kondoh et al.. Nano Lett. (2006) 2582 | TCNQ | None | Dipping Method | Cu | Pt |
| 114 | Two-Dimensional | 1D | Cu | ipa | KGM-NO2 | Compound 1 described in Burrows et al., Dalton Trans. (2008) 6788 | TCNQ | None | Dipping Method | Cu | Pt |
| 115 | Two-Dimensional | 3D | Cd | 4,4'-pytz | — | Compound 1 described in Blake et al., J. Am. Chem. Soc. (2000) 4044 | TCNQ | None | Dipping Method | Cu | Pt |
| 116 | Two-Dimensional | 1D | Ni | bpy | 2DSQG | Compound 1 described in Imamoto et al., Chem. Lett. (1999) 195 | TCNQ | None | Dipping Method | Cu | Au |
| 117 | Two-Dimensional | 1D | Co | bpy-ipa | CID | Compound 2 described in Sun et al, Cryst. Growth Des. (2010) 5020 | TCNQ | None | Dipping Method | Cu | Pt |
| 118 | Two-Dimensional | 1D | Co | btc | CJ-4 | Compound described as CJ-4 in Yu et al, Macro. Meso. Mater (2006) 145 | TCNQ | None | Dipping Method | Ag | Pt |
| 119 | One-Dimensional | 1D | Zn | bpy | — | Compound 1 described in Kitagawa et al., Chem. Lett. (1999) 285 | TCNQ | None | Dipping Method | Cu | Pt |
| 120 | One-Dimensional | 1D | Rh | pyz | — | Compound 1 described in Mori et al., Chem. Lett. (2002) 1208 | TCNQ | None | Dipping Method | Cu | Au |
| 121 | One-Dimensional | 1D | Cu | tpa | — | Compound 1 described in Mori et al., Chem. Lett. (2003) 34 | TCNQ | None | Dipping Method | Cu | Pt |
| 122 | Three-Dimensional | 3D | Cu | btc | HKUST-1 | Compound described as HKUST-1 in Williams et al., Science (1999) 283, 1148 | BEDT-TTF | None | Dipping Method | Cu | Pt |
| 123 | Two-Dimensional | 1D | Co | btc | CJ-4 | Compound described as CJ-4 in Yu et al, Macro. Meso. Mater (2006) 145 | BEDT-TTF | None | Dipping Method | Cu | Au |
| 124 | One Dimensional | | Rh | pyz | CL1208_02Mori | Compound 1 described in Mori et al., Chem. Lett. (2002) 1208 | BEDT-TTF | None | Dipping Method | Cu | Pt |
| 125 | Three-Dimensional | 3D | Cu | btc | HKUST-1 | Compound described as HKUST-1 in Williams et al., Science (1999) 283, 1148 | TCNQ | Exist | Dipping Method | Cu | Pt |

TABLE 6-continued

| Example | PCP Network | Pore Type | Metal Ion | Ligand | Name or Compositional Formula of PCP | Description of PCP Synthesis | Conductivity Aid 1 | Conductivity Aid 2 | Addition Method | Active Metal (Second Electrode) | Inactive Metal (First Electrode) |
|---|---|---|---|---|---|---|---|---|---|---|---|
| 126 | Two-Dimensional | 1D | Co | btc | CJ-4 | Compound described as CJ-4 in Yu et al, Macro. Meso. Mater (2006) 145 | TCNQ | Exist | Dipping Method | Cu | Au |
| 127 | One-Dimensional | 1D | Rh | pyz | — | Compound 1 described in Mori et al., Chem. Lett. (2002) 1208 | TCNQ | Exist | Dipping Method | Cu | Pt |
| 128 | Three-Dimensional | 3D | Cu | btc | HKUST-1 | Compound described as HKUST-1 in Williams et al., Science (1999) 283, 1148 | TCNQ | None | Ship-In-A-Bottle Method | Cu | Pt |
| 129 | Two-Dimensional | 1D | Cu | ipa | KGM-NO2 | Compound 1 described in Burrows et al., Dalton Trans. (2008) 6788 | TCNQ | None | Ship-In-A-Bottle Method | Cu | Au |
| 130 | One-Dimensional | 1D | Rh | pyz | — | Compound 1 described in Mori et al., Chem. Lett. (2002) 1208 | TCNQ | None | Ship-In-A-Bottle Method | Cu | Pt |
| 131 | Three-Dimensional | 3D | Cu | btc | HKUST-1 | — | TCNQ | None | Dipping Method | Cu | Pt |
| 132 | Three-Dimensional | 3D | Cu | btc | HKUST-1 | — | BEDT-TTF | None | Dipping Method | Cu | Pt |
| 133 | Three-Dimensional | 3D | Cu | tpa | — | — | TCNQ | None | Dipping Method | Cu | Pt |
| 134 | Three-Dimensional | 3D | Cu | tpa | — | — | BEDT-TTF | None | Dipping Method | Cu | Pt |

TABLE 7

| Comparative Example | PCP Network | Pore Type | Metal Ion | Ligand | Name or Compositional Formula of PCP | Description of PCP Synthesis | Conductivity Aid 1 | Conductivity Aid 2 | Addition Method | Active Metal (Second Electrode) | Inactive Metal (First Electrode) |
|---|---|---|---|---|---|---|---|---|---|---|---|
| 6 | Three-Dimensional | 3D | Cu | btc | HKUST-1 | Compound described as HKUST-1 in Williams et al., Science (1999) 283, 1148 | None | None | Dipping Method | Cu | Pt |
| 7 | Three-Dimensional | 3D | Cu | btc | HKUST-1 | Compound described as HKUST-1 in Williams et al., Science (1999) 283, 1148 | TCNQ | None | Dipping Method | Pt | Pt |
| 8 | Three-Dimensional | 3D | Bi | tpa | [Bi(1,4-bdc)$_2$(dmf)] | Compound 1 described in Cheetham et al., Eur. J. Inorg. Chem. (2010) 3823 | TCNQ | None | Dipping Method | Cu | Pt |

In Tables 6 and 7, abbreviations are as follows.
TCNQ: tetracyanoquinodimethane
BEDT-TTF: bis(ethylenedithio)tetrathiafulvalene
btc: trimesic acid
tpa: terephthalic acid
btb: 1,3,5-(4-carboxyphenyl)benzene
bpy: 4,4'-bipyridyl
Hatz: 3-amino-1,2,4-triazole
Bpe: 1,2-bis(4-pyridyl)ethylene
Dabco: 1,8-diazabicyclooctane
3,6-bis(pyridine-4-yl)-1,2,4,5-tetrazine
ipa: isophthalic acid
pyz: pyrazine In Tables 6 and 7, "porous coordination polymer network" represents the dimensionality (one-dimensional structure, two-dimensional structure, three-dimensional structure) of the skeleton of the porous coordination polymer. "Pore type" represents the dimensionality (one-dimensional structure, two-dimensional structure, three-dimensional structure) of the pores included in the porous coordination polymer.

Example 101

A porous coordination polymer so-called HKUST-1 (a compound described as HKUST-1 in Williams et al., Science (1999) 283, 1148) was synthesized in the presence of active metal. As a result, a thin film of HKUST-1 (thickness: about 100 microns) was formed on a surface of the active metal. This material was dipped in a dichloromethane saturated solution of tetracyanoquinodimethane as a conductivity aid at room temperature for 24 hours. The electrode having a surface on which the porous coordination polymer conductor formed by the addition of the conductivity aid was formed on a memory circuit using the above-described method, and the resistance hysteresis was checked by the above-described voltage sweep-current measurement to verify a memory effect.

Examples 102 to 121

Thin films of porous coordination polymers were formed on active metal surfaces using methods of documents described in Table 6 and were impregnated with saturated solutions of conductivity aids 1 described in Table 6 using the same method as in Example 101, respectively. As a result, electrodes having surfaces on which porous coordination polymer conductors were formed were prepared. Further, memory circuits were formed under the same conditions as in Example 101. The evaluation results are shown in Table 8. In a case where the metal ion forming the porous coordination polymer was a copper ion, the number of times of repetition was relatively low. In a case where the porous coordination polymer network was three-dimensional, the memory retention time was relatively short.

Examples 122 to 124

According to methods illustrated in Table 6, memory circuits were formed under the same conditions as in Examples 102 to 121. However, dopants were different from those of Examples 102 to 120. The evaluation results are shown in the table.

Examples 125 to 127

According to methods illustrated in Table 6, memory circuits were formed under the same conditions as in Examples 102 to 120. However, tetraethylammonium tetrafluoroborate as a conductivity aid 2 was allowed to coexist in a saturated concentration in the saturated solution of the conductivity aid 1. The evaluation results are shown in the table.

Under the conditions where the conductivity aid 2 was present, even in a case where the metal ion forming the porous coordination polymer was a copper ion, the number of times of repetition was sufficient.

Examples 128 to 130

According to methods illustrated in Table 6, memory circuits were formed under the same conditions as in Examples 102 to 120. However, during the synthesis of the porous coordination polymer, the conductivity aid 1 shown in Table 6 was allowed to coexist in a concentration which was 1/10 of the saturated concentration (ship-in-a-bottle method). The evaluation results are shown in Table 8. In a case where the ship-in-a-bottle method is used for manufacturing, even when the porous coordination polymer network is three-dimensional, the memory retention time was good.

Example 131

A copper plate was dipped in 50 mL of an ethanol solution of 0.2 mM trimesic acid, a reaction was caused to occur at 40° C. for 6 hours. Next, the copper plate was pulled out from the solution using tweezers, was dipped and washed with a dehydrated ethanol solution three times for 10 seconds each, and was dried under reduced pressure at room temperature. As a result of powder X-ray diffraction analysis, it was found that the compound formed on the copper plate was a compound described as HKUST-1 in Williams et al., Science (1999) 283, 1148. Using this material, a memory circuit was formed under the same conditions as in Example 101.

Example 132

A memory circuit was formed under the same conditions as in Example 131, except that BEDT-TTF was used as the conductivity aid 1.

Example 133

The copper plate was treated under the same conditions as in Example 131, except that terephthalic acid was used instead of trimesic acid. It was found that the compound formed on the copper plate was a compound described in Tannenbaum et al., Eur. J. Inorg. Chem., 2009, 2338 (a porous coordination polymer represented by Cu(tpa)/(dmf) that is formed of a $Cu^{2+}$ ion, terephthalic acid, and DMF as a guest molecule). Using this material, a memory circuit was formed.

Example 134

A memory circuit was formed under the same conditions as in Example 133, except that BEDT-TTF was used as the conductivity aid 1.

Comparative Example 6

A memory circuit was formed under the same conditions as in Example 101, except that the impregnation with the solution of the conductivity aid was not performed. This memory circuit did not exhibit the memory effect.

Comparative Example 7

A memory circuit was formed under the same conditions as in Example 101, except that the two electrodes were formed of platinum without using active metal. This memory circuit did not exhibit the memory effect.

Comparative Example 8

A material was prepared according to a document shown in Table 7. Using this material, a memory circuit was formed under the same conditions as in Example 101. That is, Bi (group 15) was used as the metal ion. This memory circuit did not exhibit the memory effect.

TABLE 8

| Example | Memory Function | Memory Retention Time (Sec) | Number of Times of Repetition |
|---|---|---|---|
| 101 | B | B | C |
| 102 | B | B | A |
| 103 | B | B | A |
| 104 | B | B | A |
| 105 | B | B | A |
| 106 | B | B | A |
| 107 | B | B | B |
| 108 | B | B | C |
| 109 | B | A | A |
| 110 | B | B | B |
| 111 | B | B | C |
| 112 | B | A | A |
| 113 | B | A | C |
| 114 | B | A | C |
| 115 | B | A | A |
| 116 | B | A | A |
| 117 | B | B | A |
| 118 | B | B | A |
| 119 | B | B | B |
| 120 | B | B | A |
| 121 | B | B | C |
| 122 | B | A | A |
| 123 | B | B | A |
| 124 | B | A | A |
| 125 | B | A | A |
| 126 | B | B | A |
| 127 | B | A | A |

TABLE 8-continued

| Example | Memory Function | Memory Retention Time (Sec) | Number of Times of Repetition |
|---|---|---|---|
| 128 | B | A | B |
| 129 | B | A | B |
| 130 | B | A | B |
| 131 | A-B | A | A |
| 132 | A | A | A |
| 133 | A | A | A |
| 134 | A | A | A |

TABLE 9

| Comparative Example | Memory Function | Memory Retention Time (Sec) | Number of Times of Repetition |
|---|---|---|---|
| 6 | D | D | D |
| 7 | D | D | D |
| 8 | D | D | D |

INDUSTRIAL APPLICABILITY

According to the present invention, a microswitch that is formed of a new porous coordination polymer conductor and two electrode metals can be provided, the porous coordination polymer conductor being obtained by adding a conductivity aid to a porous coordination polymer. The microswitch according to the present invention formed of the porous coordination polymer conductor and the two metals can be used as a memory. In addition, the present invention is applicable to a random access memory, a storage class memory; an integrated circuit (memory chip, LSI), a storage device (for example, a SSD, a SD card, an USB memory), or a memory circuit having a learning function, which utilizes the above memory; a circuit switching switch for a field programmable gate array (FPGA); or other devices (sensors).

The invention claimed is:

1. A microswitch comprising:
a first electrode;
a second electrode; and
a porous coordination polymer conductor,
wherein the porous coordination polymer conductor is represented by the following Formula (1), and
a metal forming the first electrode and a metal forming the second electrode have different oxidation-reduction potentials,

$$[ML_x]_n(D)_y \quad (1),$$

where M represents a metal ion selected from group 2 to group 13 elements in a periodic table, L represents a ligand that has two or more functional groups capable of coordination to M in a structure of L and is crosslinkable with two M's, D represents a conductivity aid that includes no metal element, x represents 0.5 to 4, y represents 0.0001 to 20 with respect to x as 1, n represents the number of repeating units of a constituent unit represented by $[ML_x]$, and n represents 5 or more.

2. The microswitch according to claim 1,
wherein D represents a compound having a carbon-carbon multiple bond in a molecule and having a sulfur or nitrogen atom.

3. The microswitch according to claim 1,
wherein D represents a compound having a carbon-carbon multiple bond in a molecule and having an electron-withdrawing group or an electron-donating group bonded to the carbon-carbon multiple bond, or an aromatic compound having an extended conjugated system.

4. The microswitch according to claim 2,
wherein D represents an acceptor compound selected from the group consisting of tetracyanoethylene, tetracyanoquinodimethane, benzoquinone, and a derivative thereof.

5. The microswitch according to claim 2,
wherein D represents a donor compound selected from tetrathiafulvalene and a derivative thereof.

6. The microswitch according to claim 1,
wherein the porous coordination polymer conductor includes two or more D's.

7. The microswitch according to claim 6,
wherein at least one of the two or more D's is an organic conductivity aid that is formed of an organic material having electric charge in a molecule.

8. The microswitch according to claim 7,
wherein the organic conductivity aid is selected from the group consisting of a quaternary ammonium salt, a phosphonium salt, an amine-alkali metal ion complex, an imidazolium salt, a pyridinium salt, and a sulfonium salt.

9. The microswitch according to claim 1,
wherein a D content is 0.001 to 30 mass % with respect to the porous coordination polymer conductor.

10. The microswitch according to claim 1,
wherein M represents a divalent, trivalent, or tetravalent metal ion selected from the group consisting of chromium, manganese, iron, cobalt, nickel, copper, zinc, a rare earth element, and zirconium.

11. The microswitch according to claim 1,
wherein L represents an aromatic compound having two or more carboxyl groups in a molecule.

12. The microswitch according to claim 1,
wherein L represents a non-aromatic compound having two or more carboxyl groups in a molecule.

13. The microswitch according to claim 11,
wherein L represents an aromatic compound having two or more coordinating nitrogen atoms in a molecule.

14. The microswitch according to claim 12,
wherein L represents a non-aromatic compound having two or more coordinating nitrogen atoms in a molecule.

15. The microswitch according to claim 1,
wherein M is selected from the group consisting of magnesium, aluminum, calcium, scandium, manganese, iron (II), iron (III), cobalt, nickel, copper, zinc, zirconium, ruthenium, rhodium, palladium, silver, cadmium, indium, and rhenium, and
L is selected from the group consisting of substituted or unsubstituted terephthalic acid, isophthalic acid, 2,6-naphthalenedicarboxylic acid, 2,7-naphthalenedicarboxylic acid, 4,4'-biphenyldicarboxylic acid, trimesic acid, substituted or unsubstituted 4,4'-bipyridine, 1,4-(4-pyridyl)benzene, and substituted or unsubstituted imidazole.

16. The microswitch according to claim 1,
wherein a difference between the oxidation-reduction potential of the metal forming the first electrode and the oxidation-reduction potential of the metal forming the second electrode is 0 eV to 5.0 eV.

17. The microswitch according to claim 1,
wherein the metal forming the first electrode is a metal selected from the group consisting of Au, Pt, W, Ru, In, Rh, and silicon, and the metal forming the second electrode is a metal selected from the group consisting of Cu, Ag, Zn, Co, Mn, and Al.

18. The microswitch according to claim 17,
wherein the metal forming the first electrode is selected from the group consisting of indium tin oxide (ITO: Tin-doped $In_2O_3$), titanium oxide doped with Nb, zinc oxide doped with Ga or Al, and $SrTiO_3$, $SrRuO_3$, $RuO_2$, or $IrO_2$ doped with Nb.

19. An electronic device that is configured using the microswitch according to claim 1.

20. A method of manufacturing a microswitch for a CB-RAM, the method comprising:
   forming a porous coordination polymer by mixing a metal ion and a ligand with each other;
   bringing the porous coordination polymer into contact with first and second electrodes; and
   forming a porous coordination polymer conductor by mixing the porous coordination polymer in contact with the first and second electrodes and a conductivity aid with each other,
   wherein the metal ion is selected from group 2 to group 13 elements in a periodic table,
   the ligand has two or more functional groups capable of coordination to the metal ion in a structure of the ligand and is crosslinkable with two metal ions,
   the conductivity aid is a material that includes no metal element, and
   a metal forming the first electrode and a metal forming the second electrode have different oxidation-reduction potentials.

21. A method of manufacturing a microswitch, the method comprising:
   forming a porous coordination polymer conductor by mixing a metal ion, a ligand, and a conductivity aid with each other; and
   bringing the porous coordination polymer conductor into contact with first and second electrodes,
   wherein the metal ion is selected from group 2 to group 13 elements in a periodic table,
   the ligand has two or more functional groups capable of coordination to the metal ion in a structure of the ligand and is crosslinkable with two metal ions,
   the conductivity aid is a material that includes no metal element, and
   a metal forming the first electrode and a metal forming the second electrode have different oxidation-reduction potentials.

* * * * *

UNITED STATES PATENT AND TRADEMARK OFFICE
CERTIFICATE OF CORRECTION

PATENT NO. : 11,127,898 B2  
APPLICATION NO. : 16/071296  
DATED : September 21, 2021  
INVENTOR(S) : Hiroshi Kajiro et al.

Page 1 of 1

It is certified that error appears in the above-identified patent and that said Letters Patent is hereby corrected as shown below:

On the Title Page

Change:  
"(73) Assignee: NIPPON STEEL CORPORATION TOKYO (JP)"  
To:  
--(73) Assignees: NIPPON STEEL CORPORATION TOKYO (JP)  
                NATIONAL UNIVERSITY CORPORATION TOTTORI UNIVERSITY  
                TOTTORI-SHI, TOTTORI (JP)--

Signed and Sealed this  
Ninth Day of November, 2021

Drew Hirshfeld  
*Performing the Functions and Duties of the*  
*Under Secretary of Commerce for Intellectual Property and*  
*Director of the United States Patent and Trademark Office*